US008228675B2

(12) United States Patent
Koplow

(10) Patent No.: US 8,228,675 B2
(45) Date of Patent: Jul. 24, 2012

(54) HEAT EXCHANGER DEVICE AND METHOD FOR HEAT REMOVAL OR TRANSFER

(75) Inventor: Jeffrey P. Koplow, San Ramon, CA (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 12/732,662

(22) Filed: Mar. 26, 2010

(65) Prior Publication Data
US 2010/0177480 A1 Jul. 15, 2010

Related U.S. Application Data

(63) Continuation of application No. PCT/US2009/044550, filed on May 19, 2009, which is a continuation-in-part of application No. 12/185,570, filed on Aug. 4, 2008.

(60) Provisional application No. 61/164,188, filed on Mar. 27, 2009, provisional application No. 61/008,271, filed on Dec. 18, 2007.

(51) Int. Cl.
*H05K 7/20* (2006.01)

(52) U.S. Cl. ............... 361/697; 361/679.47; 361/679.48; 361/679.54; 361/695; 361/696; 165/80.3; 165/104.33; 165/121

(58) Field of Classification Search .............. 361/679.46–679.51, 690–695, 361/704–717, 719–721; 165/80.2, 80.3, 165/80.4, 104.33, 186, 165, 85, 86; 415/1, 415/66, 68, 67, 119, 141, 177, 178, 199.4, 415/206, 220; 416/143, 146 R, 170 R, 186 R, 169 A, 189, 242, 235, 236 R, 237; 417/423.8; 310/179, 63, 64, 688, 695, 309, 156.38; 257/706, 722, E23.09, E23.099
See application file for complete search history.

(56) References Cited

U.S. PATENT DOCUMENTS

| | | | | | |
|---|---|---|---|---|---|
| 3,844,341 | A | * | 10/1974 | Bimshas et al. | 165/86 |
| 4,164,690 | A | * | 8/1979 | Muller et al. | 318/400.41 |
| 5,000,254 | A | * | 3/1991 | Williams | 165/85 |
| 5,197,858 | A | * | 3/1993 | Cheng | 417/14 |
| 5,296,775 | A | * | 3/1994 | Cronin et al. | 310/309 |
| 5,297,623 | A | * | 3/1994 | Ogushi et al. | 165/121 |
| 5,335,143 | A | * | 8/1994 | Maling et al. | 361/694 |
| 5,583,746 | A | * | 12/1996 | Wang | 361/697 |
| 5,616,974 | A | * | 4/1997 | Yamada | 310/68 B |
| 5,727,928 | A | * | 3/1998 | Brown | 417/44.11 |
| 5,736,787 | A | | 4/1998 | Larimer | 257/732 |
| 5,794,687 | A | * | 8/1998 | Webster et al. | 165/121 |
| 5,957,659 | A | * | 9/1999 | Amou et al. | 415/178 |
| 5,963,887 | A | * | 10/1999 | Giorgio | 702/64 |
| 5,979,541 | A | * | 11/1999 | Saito | 165/80.3 |
| 6,050,326 | A | * | 4/2000 | Evans et al. | 165/80.2 |
| 6,078,468 | A | | 6/2000 | Fiske | 360/104 |
| 6,194,798 | B1 | * | 2/2001 | Lopatinsky | 310/63 |

(Continued)

FOREIGN PATENT DOCUMENTS

JP 407169887 A * 7/1995

(Continued)

*Primary Examiner* — Michail V Datskovskiy
(74) *Attorney, Agent, or Firm* — Dorsey & Whitney LLP

(57) ABSTRACT

Systems and methods for a forced-convection heat exchanger are provided. In one embodiment, heat is transferred to or from a thermal load in thermal contact with a heat conducting structure, across a narrow air gap, to a rotating heat transfer structure immersed in a surrounding medium such as air.

19 Claims, 12 Drawing Sheets

U.S. PATENT DOCUMENTS

| | | | |
|---|---|---|---|
| 6,249,071 B1 * | 6/2001 | Lopatinsky et al. | 310/156.38 |
| 6,356,435 B1 | 3/2002 | Davis et al. | 361/678 |
| 6,392,720 B1 * | 5/2002 | Kim | 349/42 |
| 6,457,955 B1 * | 10/2002 | Cheng | 417/423.8 |
| 6,525,938 B1 * | 2/2003 | Chen | 361/695 |
| 6,545,438 B1 * | 4/2003 | Mays, II | 318/400.01 |
| 6,619,385 B2 * | 9/2003 | Watanabe et al. | 165/121 |
| 6,659,169 B1 * | 12/2003 | Lopatinsky et al. | 165/121 |
| 6,664,673 B2 * | 12/2003 | Lopatinsky et al. | 310/63 |
| 6,860,323 B2 | 3/2005 | Cheng | 165/121 |
| 6,873,069 B1 * | 3/2005 | Odagiri et al. | 310/64 |
| 6,876,550 B2 * | 4/2005 | Sri-Jayantha et al. | 361/699 |
| 6,879,120 B2 * | 4/2005 | Xi | 318/400.01 |
| 6,955,215 B2 * | 10/2005 | Al-Garni et al. | 165/185 |
| 6,966,357 B1 * | 11/2005 | Herbert | 165/80.3 |
| 7,021,894 B2 * | 4/2006 | Lopatinsky et al. | 415/176 |
| 7,035,102 B2 | 4/2006 | Holmes et al. | 361/695 |
| 7,044,202 B2 * | 5/2006 | Lopatinsky et al. | 165/122 |
| 7,055,581 B1 | 6/2006 | Roy | 165/104.33 |
| 7,071,587 B2 * | 7/2006 | Lopatinsky et al. | 310/64 |
| 7,134,839 B2 * | 11/2006 | Horng et al. | 415/199.4 |
| 7,136,285 B1 * | 11/2006 | Herbert | 361/695 |
| 7,165,938 B2 * | 1/2007 | Lee et al. | 415/206 |
| 7,265,975 B2 | 9/2007 | Tsai | 361/698 |
| 7,267,526 B2 * | 9/2007 | Hsu et al. | 415/184 |
| 7,273,091 B2 * | 9/2007 | Bahl et al. | 165/121 |
| 7,304,845 B2 | 12/2007 | Xia et al. | 361/697 |
| 7,324,339 B2 | 1/2008 | Foster, Sr. et al. | 361/697 |
| 7,349,212 B2 | 3/2008 | Xia et al. | 361/697 |
| 7,381,027 B2 * | 6/2008 | Kaneko et al. | 415/206 |
| 7,455,501 B2 * | 11/2008 | Horng et al. | 415/220 |
| 7,481,263 B2 * | 1/2009 | Breier et al. | 165/80.4 |
| 7,520,314 B2 * | 4/2009 | Hwang et al. | 165/80.3 |
| 7,695,256 B2 * | 4/2010 | Horng et al. | 417/420 |
| 7,836,939 B2 * | 11/2010 | Zimmerman et al. | 165/80.1 |
| 7,896,611 B2 * | 3/2011 | Khanna et al. | 415/177 |
| 7,900,690 B2 * | 3/2011 | Hawwa et al. | 165/86 |
| 7,905,712 B2 * | 3/2011 | Huang | 417/423.7 |
| 2002/0090307 A1 | 7/2002 | Cheng | 417/423.1 |
| 2004/0035556 A1 * | 2/2004 | Jean | 165/86 |
| 2004/0109291 A1 | 6/2004 | Kannmacher et al. | 361/704 |
| 2004/0119354 A1 | 6/2004 | Takada et al. | 310/90 |
| 2005/0002163 A1 | 1/2005 | Lopatinsky et al. | 361/697 |
| 2005/0195573 A1 | 9/2005 | Huang | 361/709 |
| 2006/0021735 A1 | 2/2006 | Lopatinsky et al. | 165/80.3 |
| 2007/0041158 A1 | 2/2007 | Hornung | 361/695 |
| 2007/0231419 A1 * | 10/2007 | Pelcz et al. | 425/72.1 |
| 2008/0069706 A1 * | 3/2008 | Huang | 417/351 |
| 2009/0145584 A1 * | 6/2009 | Walsh et al. | 165/122 |

FOREIGN PATENT DOCUMENTS

JP    02000341902 A  * 12/2000

\* cited by examiner

HEAT EXCHANGER DEVICE AND METHOD FOR HEAT REMOVAL OR TRANSFER

CROSS REFERENCE TO RELATED APPLICATIONS

This application is a continuation of International Application No. PCT/US2009/044550, filed May 19, 2009, entitled "HEAT EXCHANGER DEVICE AND METHOD FOR HEAT REMOVAL OR TRANSFER", which is a continuation-in-part of U.S. patent application Ser. No. 12/185,570, filed Aug. 4, 2008, entitled "HEAT EXCHANGER DEVICE AND METHOD FOR HEAT REMOVAL OR TRANSFER", and U.S. Provisional Patent Application Ser. No. 61/164,188, filed Mar. 27, 2009, entitled "HEAT EXCHANGER AND METHOD FOR HEAT REMOVAL OR TRANSFER".

This application is also a continuation-in-part of U.S. patent application Ser. No. 12/185,570, filed Aug. 4, 2008, entitled "HEAT EXCHANGER DEVICE AND METHOD FOR HEAT REMOVAL OR TRANSFER," which application claims the benefit of U.S. Provisional Patent Application Ser. No. 61/008,271, filed Dec. 18, 2007, entitled "COOLING DEVICE".

This application also claims the benefit of U.S. Provisional Patent Application Ser. No. 61/164,188 filed Mar. 27, 2009, entitled "HEAT EXCHANGER AND METHOD FOR HEAT REMOVAL OR TRANSFER".

STATEMENT OF GOVERNMENT SUPPORT

The United States Government has a paid-up license in this technology and the right in limited circumstances to require the patent owner to license others on reasonable terms as provided for by the terms of contract No. DE-AC04-94AL85000 awarded by the U.S. Department of Energy to Sandia Corporation.

These applications are each incorporated herein by reference.

FIELD

This application includes embodiments related to devices, methods and systems for a new type of forced-air heat exchanger designed to overcome several limitations of the prior art.

BACKGROUND

To illustrate the problem of thermal management, reference is made to the computer and microelectronics industry. Progress in VLSI (Very Large Scale Integration) semiconductor technology is often discussed in terms of Moore's Law, which in its most common definition predicts a doubling of the number of transistors per CPU (Central Processing Unit) every 18 months. In 1971, Intel introduced the "4004" processor, which contained 2,300 transistors and ran at a clock speed of 740 kHz. By 2006, processors with over a billion transistors and clock speeds in excess of 3 GHz had become commercially available. Many such modem CPUs generate well in excess of 100 W of waste heat. Continued progress in advancing CPU capability is now seriously hampered by the problem of thermal management. The limitations of state-of-the-art thermal management technology fall well short of what is required to continue along the growth curve of Moore's Law, a situation that has been termed the "thermal brick wall" problem.

An example of a current state of the art CPU cooler is shown in FIG. 1, which includes a finned metal heat sink 1 with a flat bottom surface (to facilitate making a low thermal-resistance connection to a thermal load), and an axial fan 2 for generating an airflow that impinges on the heat sink fins. The heat sink 1 has a plurality of fins to increase the heat-exchanging surface area and is made from a material with high thermal conductivity, such as aluminum. The choice of material used for the metal heat sink may also reflect other requirements, such as the need to make the heat sink light-weight, low-cost, easy to manufacture (e.g., the use of an alloy with good mechanical forming properties), etc. Also included are fastening means 3 and 4 for securing fan 2 to heat sink 1.

In the vast majority of desktop and laptop computers, the CPU is mounted in direct thermal contact with a CPU cooler such as that shown in FIG. 1, or connected indirectly through a heat extraction device such as a heat pipe. The state of the art for electronics thermal management technology may be further illustrated with reference to art covered by U.S. Patent Classification Classes and Subclasses 165/121, 165/104.33 and 361/697 and particularly to U.S. Pat. Nos. 7,349,212, 7,304,845, 7,265,975, 7,035,102, 6,860,323, 6,356,435 and published U.S. Patent Publication Numbers 2004/0109291, 2005/0195573 and 2007/0041158.

Early on in the semiconductor industry, component designers realized that many devices such as power transistors required some form of thermal management in order to maintain adequate device temperature operating margins (cf. U.S. Pat. No. 5,736,787). To solve this problem, such components were typically mounted in direct contact with a finned metal heat sink. Such finned heat sinks relied primarily on natural convection to circulate air through the cooling fins. Eventually it became routine to use a fan for assisting air movement over and around the heat sink to improve the rate and efficiency of heat extraction from the heat sink. Over time, heat sinks for electronics cooling grew larger in size, incorporated larger numbers of fins, and used ever more elaborate fin geometries in an attempt to further improve heat exchange between the heat sink and surrounding air. This "heat-sink-plus-fan" architecture (see FIG. 1) still represents the state of the art in air-cooled heat exchanger technology (cf. Incropera F. P., Dewitt D. P., Bergman, T. L. and Levine, A. S., *Fundamentals of Heat and Mass Transfer,* 6th Edition, John Wiley & Sons, New York, 2007).

Until the mid 1990s, relatively little attention was paid to the performance of the air-cooled heat exchangers used for CPU cooling. The cooling capacity of such "heat-sink-plus-fan" (HSPF) devices was more than adequate for the vast majority of CPU applications, and the electrical power consumption of early HSPF devices was relatively low (typically on the order of 1 Watt). But eventually, increased transistor densities and higher clock speeds began to create a demand for better thermal management technology. This lead to the development of greatly improved technology for waste heat extraction, primarily practical heat pipe technology and improved thermal-interface materials. On the other hand, nearly all of the performance improvements in waste heat disposal were achieved by scaling up the size of devices based on the standard HSPF architecture; to address the problem of escalating CPU power dissipation, both the fan and the finned metal heat sink were simply made larger.

Note the distinction between "waste heat extraction" and "waste heat disposal". As mentioned above, prior to the mid-1990s, the cooling capacity of HSPF devices was more than adequate for the vast majority of CPU applications. Typically, the main concern was creating and maintaining a low-thermal-resistance joint, which presented a challenge because the amount of surface area available for such a thermally conductive joint may be relatively small, and because the joint may be subjected to repeated thermal cycling. For this reason, the problem of thermal management has long been regarded by many as primarily a process of waste heat extraction, where in fact, thermal management also comprises a second step of waste heat disposal. In the heat extraction step, heat is removed from a high-thermal-density region such as a CPU chip and redistributed over a larger area to facilitate the second step of heat disposal, in which the waste heat is transferred to the surrounding air. The distinction between heat extraction and heat disposal, however, is often a source of confusion. For example, heat pipes, such as those used in laptop computers, may not provide any functionality with regard to heat disposal. The purpose of a heat pipe may be to extract a large quantity of heat through a small area of contact and to convey that heat to a heat exchanger, such as a finned heat sink used in conjunction with a fan, or a passive heat sink such as the metal chassis of a laptop computer. The same may be said of the thermoelectric "coolers" based on the Peltier effect, which are electrically powered heat pumps that may be used to enhance the transport of heat between a thermal load and a heat exchanger; it is the heat exchanger that ultimately performs the function of exporting substantially all of the waste heat to the surrounding air (or other thermal reservoir capable of absorbing large quantities of heat).

Of course, heat disposal may also involve transfer to water or another coolant, but for the vast majority of practical applications, the goal is to transfer waste heat to the large thermal reservoir provided by the surrounding atmosphere. With the exception of heat pipes, which can be implemented in the form of a hermetically sealed metal enclosure, there has been a great deal of reluctance to adopt cooling methodologies that entail any kind of liquid handling and/or containment. In fact, it has long been known that the thermal brick wall problem can, to a large extent, be addressed by resorting to the use of heat conducting liquids because of their superior thermal transport properties. Nonetheless, cooling systems that entail the use of liquids have not penetrated applications such as mass-marketed personal computers because of practical, rather than performance, considerations.

In recent years, the greatly increased size, weight and power consumption of air-cooled heat exchangers used for CPU cooling have begun to reach the limits of practicality for most commercial applications (most notably, mass produced personal computers for use in home and office environments). The high level of audible noise generated by the larger, more powerful fans used in high-capacity CPU coolers has also proved a deterrent to further scaling of HSPF devices (cf. Thompson, R. J. and Thompson B. F., *Building the Perfect PC*, O'Reilly Media, Inc., Sebastapol, Calif., 2004).

Meanwhile, progress in VLSI technology has continued. In many real-world applications, the performance of air-cooled heat exchanger technology is now the primary limiting factor to further improvements in CPU performance. Continued progress along the growth curve of Moore's Law is no longer dictated solely by improvements in VLSI technology. Because of thermal limitations, VLSI advances such as higher transistor density and the ability to operate at higher clock speeds can no longer be readily exploited.

The cooling capacity of a heat exchanger can be defined in terms of its thermal conductance, $G=dP/dT$, where P is the power dissipation of the thermal load, and T is the temperature of the heat exchanger at the interface between the heat exchanger and the thermal load, such that the SI unit for thermal conductance is $W\ K^{-1}$. By convention, however, nearly all of the data sheets for CPU coolers specify performance in terms of thermal resistance, $R\ (K\ W^{-1})$, the reciprocal of thermal conductance. Note that in addition to the above IUPAC (International Union of Pure and Applied Chemistry) definitions for thermal resistance and thermal conductance (cf. www.iupac.org), other names and symbols are sometimes used in the prior art to represent the same quantities (e.g., the use of the symbol "θ" for thermal resistance).

The thermal resistance of a mid-sized CPU cooler such as that shown in FIG. 1 is typically on the order of $1\ K\ W^{-1}$. Several much larger and heavier high-capacity CPU coolers are commercially available that provide thermal resistances as low as $0.3\ K\ W^{-1}$. But to the extent that further increases in the size, weight, and electrical power consumption of air-cooled heat sinks have become prohibitive for applications such as personal computers, efforts must now be directed at improving the three specific cooling capacity metrics for heat exchangers: cooling capacity per unit volume ($W\ K^{-1}\ m^{-3}$), cooling capacity per unit weight ($W\ K^{-1}\ kg^{-1}$), and cooling capacity per unit power consumption ($K^{-1}$).

The essence of the "thermal brick wall" problem is that all practical options for increasing the specific capacity of devices such as CPU coolers appear to have already been exhausted. For example, steady progress over the past two decades has increased the electrical-to-mechanical efficiency of the brushless motors used in many cooling fans to a typical value of 95%. This leaves very little room for improvement. Similarly, there are thousands of references in the scientific and engineering literature on the subject of heat sink fin geometry, and optimization of the air-flow-to-heat-sink interaction. This work has resulted in a better understanding of the flow-field-heat-sink interaction, but this better understanding of the flow-field-heat-sink interaction has only led to incremental refinements in device architecture and performance.

The current state of electronics thermal management technology was summarized by DARPA (the Defense Advanced Research Projects Agency) in a January 2008 call for research proposals on new ideas for air-cooled heat exchanger technology:

"Over the past 40 years, CMOS, telecommunications, active sensing and imaging and other technologies have undergone tremendous technological innovation. Over this same historical period the technologies, designs and performance of air-cooled heat exchangers have remained unchanged. The performance data for today's state of the art heat exchangers and blowers is, in many cases, based on measurements performed in the 1960s."

DARPA, perhaps most well known for initiating development of the Internet in the 1970s, has now decided that considerable resources must be directed towards solving the air-cooling problem (cf. www.darpa.mil/baa, DARPA Broad Agency Announcement 08-15, Jan. 8, 2008).

This technology stagnation might seem unlikely given that advances in VLSI technology have created tremendous economic incentive for improvement of air-cooled heat exchanger technology; the current market for electronics thermal management technology is ~$5 B/yr. Part of the explanation for the lack of progress despite such large economic incentive is related to the fundamental nature of the physical effects that limit the performance of the HSPF architecture, which are discussed at length below.

The other significant contributor to technology stagnation appears to be a trend towards optimizing specific aspects of thermal management technology, rather than reconsideration of the problem as a whole. The operation of a device such a conventional CPU cooler is governed by physical processes spanning multiple engineering disciplines. As a result, an individual working on refinements to fan technology may regard a finned metal heat sink as a standardized building block that can be considered for all intents and purposes a "black box". Likewise, an individual focused on improvement of extruded aluminum heat sink technology may regard a fan as a black box that consumes electrical power and provides airflow. Specialization in a particular area can make it very difficult to appreciate the question of optimized thermal management in its entirety. For example, one interesting observation is that the data sheets for commercially available fans used for CPU cooling rarely, if ever, provide any specification for the mechanical efficiency of the fan (i.e., the efficiency for conversion of rotary mechanical power to air flow). This is unfortunate, because as discussed below, the mechanical efficiency of the fan used in a device such as a CPU cooler turns out to have profound implications with regard to the question of overall device architecture. More generally, rethinking the problem of forced air cooling requires a reexamination of the assumptions that underlie the traditional HSPF architecture and the associated stagnation in air-cooled heat exchanger technology.

Because heat transfer is an area of fundamental technological importance, the application area for embodiments described herein is extremely broad. The preceding discussion has emphasized applications in the area of electronics cooling, where thermal management may be applied to one or more active and/or passive electronic components, including but not limited to a resistor, capacitor, inductor, transformer, diode, rectifier, thyristor, transistor, amplifier, integrated circuit, display driver, line driver, buffer, microprocessor, central processing unit, graphics processing unit, coprocessor, transducer, sensor, actuator, power supply, A.C. to D.C. converter, D.C. to A.C. converter, D.C. to D.C. converter, A.C. to A.C. converter, or printed circuit assembly. But it should be understood that embodiments described herein may be applicable to a wide variety of other technology areas (e.g., in the energy sector). Clearly, any device comprising one or more forced-air heat exchangers may benefit significantly from a reduction in the size, weight, energy consumption, and/or noise of such a heat exchanger. But in addition, the energy efficiency of such a device as a whole may be improved significantly by lowering the thermal resistance of the heat exchanger.

For example, in the energy sector, a wide variety of devices used to interconvert heat and mechanical work take the form of a heat engine sandwiched between two heat exchangers. Such a heat engine may be used to generate mechanical work from the spontaneous flow of heat from a high temperature source (hereafter referred to as a "thermal source") to a low temperature sink (hereafter referred to as a "thermal sink"). For example, a steam turbine may generate mechanical work from spontaneous flow of heat from a thermal source, such as the combustion of fuel, to a thermal sink, such as the surrounding atmosphere. The maximum theoretical efficiency of such a heat engine is known as the Carnot efficiency, which may be expressed:

$$\varepsilon_{Carnot} = \frac{\Delta T}{T_{source}}$$

where T is absolute temperature, and $\Delta T$ is the difference in temperature between the thermal source and the thermal sink.

FIG. 2 illustrates a heat engine that comprises an input shaft 5 for input or output of mechanical work, a first heat exchanger 6 in thermal contact with a thermal source, and a second, identical heat exchanger 7 in thermal contact with a thermal sink. In an ideal heat engine, all of the heat that flows between the thermal source and thermal sink flows through the heat engine, there are no losses such as friction in the mechanical portion of the heat engine, the flow of heat is carried out as a reversible process, and the heat engine is thermally coupled to the thermal source and thermal sink with zero thermal resistance. In a real-world version of the heat engine shown in FIG. 2, some portion of heat transferred between the thermal source and thermal sink flows through thermal leakage paths, there are non-zero frictional losses inside the heat engine, the flow of heat must to some extent be carried out as an irreversible process to provide a reasonable rate of conversion between heat and work, and the heat exchangers that thermally couple the heat engine to the thermal source and thermal sink have finite thermal resistance. These four non-ideal effects make the actual efficiency that can be achieved in such a heat engine less than the Carnot efficiency (cf. Kittel, C. and Kroemer, H., *Thermal Physics*, 2nd Edition, W.H. Freeman & Company, New York, 1997). Methods by which any of these four sources of inefficiency can be substantially reduced relative to the prior art are of great technological and economic importance.

Such a heat engine may also be used as a "heat pump", in which mechanical work is used to generate non-spontaneous flow of heat from a low temperature sink to a high temperature source. For example, a refrigerator may use mechanical work supplied by an electric motor to generate non-spontaneous flow of heat from a low temperature sink (e.g., the air inside a refrigerator) to a high temperature source (e.g., the air outside a refrigerator). The ratio of heat transferred to mechanical work supplied has a maximum theoretical value known as the Carnot coefficient of refrigerator performance:

$$\gamma_{Carnot} = \frac{T_{sink}}{\Delta T}$$

To illustrate the importance of heat exchanger performance, we may consider a device such as a window-mounted air conditioner. Such a device may consist of a heat pump sandwiched between two forced-air heat exchangers. The thermal sink may be the interior room air (e.g., $T_{SINK}$=300 K), and the thermal source may be the outside air on a hot summer day (e.g., $T_{SOURCE}$=320 K). The two heat exchangers have a non-zero, and in this example equal, thermal resistance. During operation, a quantity of heat (q) flowing through the finite thermal resistance (R) of the two heat exchangers results in a temperature drop of qR across each heat exchanger. Under such conditions, the maximum efficiency of the heat engine is reduced to:

$$\gamma_{Carnot} = \frac{T_{sink} - qR}{\Delta T + 2qR}$$

where q (units: W) is the heat flux through the air conditioner and R (units: K W$^{-1}$) is the heat exchanger thermal resistance. For $T_{SINK}$=300 K and $T_{SOURCE}$=320 K, a temperature drop of 10 K across each heat exchanger reduces the Carnot coefficient of refrigerator performance by a factor of ~2, and may therefore increase electrical power consumption by a factor of ~2. Accordingly, in applications such as air conditioning, where the difference in temperature between the thermal source and the thermal sink is relatively small, lowering the thermal resistance of such an air-cooled heat exchanger can reduce electrical power consumption considerably (or, for a given coefficient of performance, increase cooling capacity). Lastly, in addition to air conditioning, any such improved heat exchanger may be used for applications such as heaters, refrigerators, freezers, absorption chillers, evaporative coolers, thermal reservoirs, condensers, radiators, heat pumps, heat engines, motors, or generators.

BRIEF DESCRIPTION OF THE DRAWINGS

The accompanying drawings, which are incorporated into and form a part of the specification, illustrate one or more embodiments of the present application and, together with the description, serve to explain the principles of various embodiments. The drawings are only for the purpose of illustrating various embodiments, and are not to be construed as limiting. In the drawings.

DETAILED DESCRIPTION OF EMBODIMENTS

In the following detailed description, reference is made to the accompanying drawings which form a part hereof and in which is shown, by way of illustration, specific embodiments and the manner in which they may be practiced. These embodiments are described in sufficient detail to enable those skilled in the art to practice such embodiments, and it is to be understood that other embodiments may be utilized and that structural changes may be made without departing from the spirit and scope of the embodiments described herein. Therefore, the following detailed description is not to be taken in a limiting sense, and the scope of this application is defined by appended claims.

As discussed above, progress in forced-air heat exchanger technology is hampered by the fundamental physical limitations of the traditional "heat-sink-plus-fan" (HSPF) device architecture. In particular, it is well known that boundary layer effects impose fundamental limitations on HSPF device performance (cf. Kutz, M., *Heat Transfer Calculations*, McGraw-Hill, New York, 2005). In qualitative terms, a "boundary layer" can be considered a stationary layer of "dead air" that clings to the surface of a structure (e.g., a finned heat sink) and acts like an insulating blanket. In conventional HSPF devices, the difference in temperature between the base of the finned heat sink and ambient air may be almost entirely accounted for by the temperature drop across such a boundary layer. Within such a boundary layer, molecular diffusion is typically the primary transport mechanism for conduction of heat, resulting in very poor heat transfer.

Figure 1:
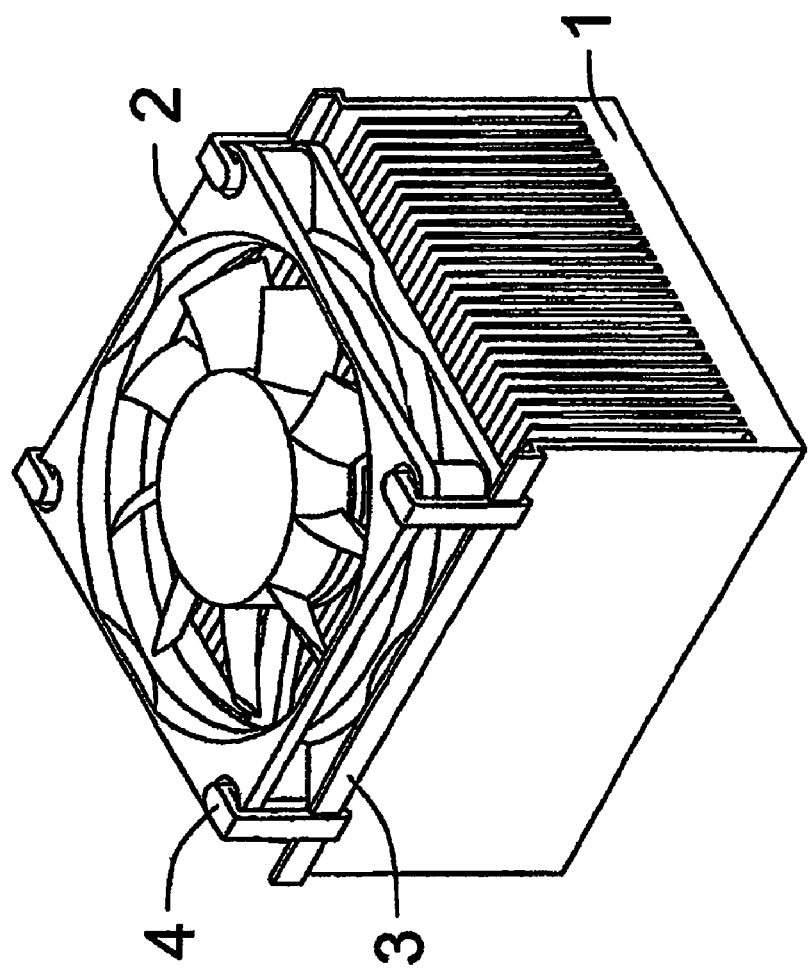
FIG. 1 illustrates an example of a prior art, a forced-air heat exchanger based on the traditional heat-sink-plus-fan (HSPF) device architecture.
Figure 2:
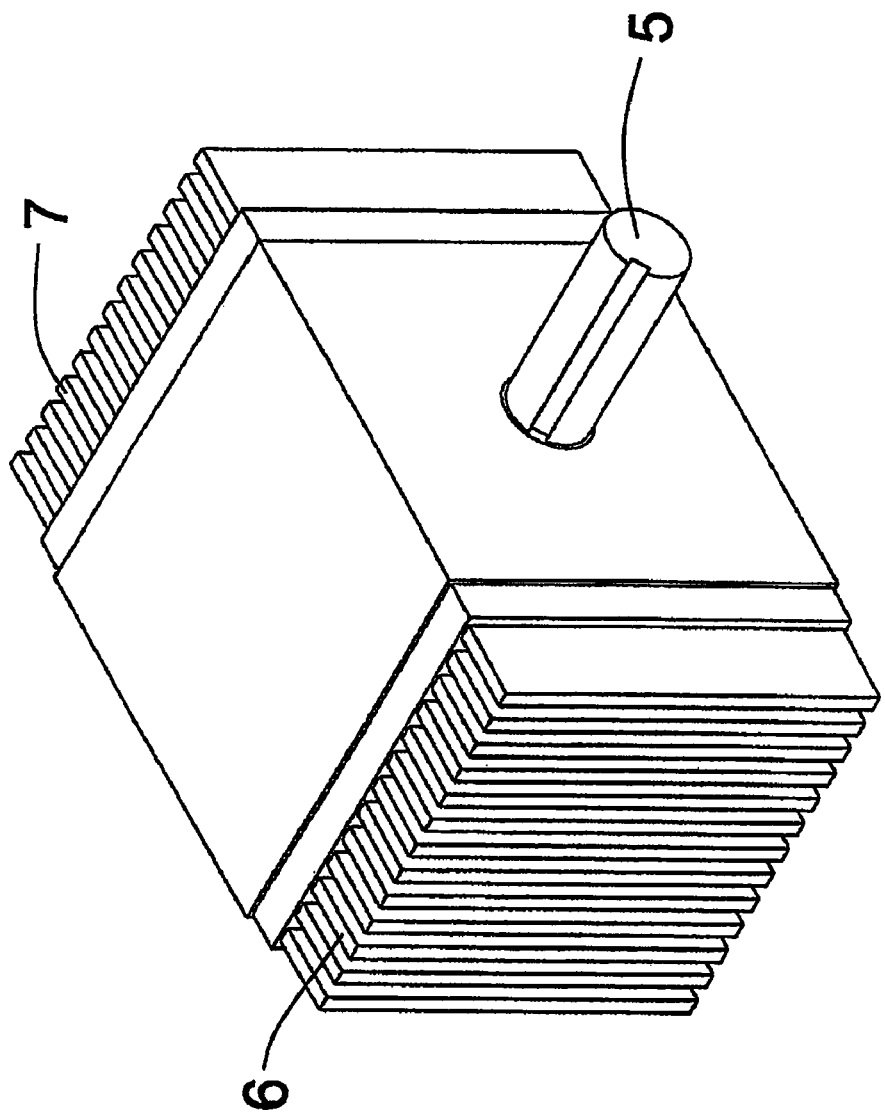
FIG. 2 illustrates a heat engine.

Accordingly, the designs of many high-performance air-cooling devices place a great deal of emphasis on boundary layer disruption. For example, air-jet-impingement cooling, in which a high-pressure pump generates a jet of compressed air that is directed at a heat sink surface, is very effective at reducing the thickness of the boundary layer. But the electrical power consumption and cost of air-jet-impingement cooling is prohibitive for most applications. In devices such as the CPU cooler shown in FIG. 1, although the fan generates a large amount of turbulence, only a modest reduction in the effective boundary layer thickness is observed relative to the case of laminar flow. This boundary-layer disruption effect can be increased somewhat by running the fan at higher speed, but the tradeoff with respect to electrical power consumption quickly becomes very unfavorable.

The efficiency of the heat exchange process ($\epsilon_G$) can be quantified by considering a maximum theoretical value of thermal conductance (G) for an ideal heat exchanger, in which heat transfer is limited only by the heat capacity of the flowing air stream:

$$\varepsilon_G = \frac{G}{G_{ideal}} = \frac{G}{C_p \rho \Phi} = \frac{1}{RC_p \rho \Phi},$$

where G and R are the thermal conductance and resistance, respectively (defined earlier), $C_p$ is the heat capacity of air at constant pressure, $\rho$ is the density of air, and $\Phi$ is the volumetric flow rate of air through the finned heat sink. For the prior art device shown in FIG. 1, $\epsilon_G$ is about 10%, for example:

$$\varepsilon_G = \frac{1}{(0.92 \text{ KW}^{-1})(1.0 \times 10^3 \text{ Jkg}^{-1}\text{K}^{-1})(1.2 \text{ kgm}^{-3})(9.5 \times 10^{-3} \text{m}^3\text{s}^{-1})}$$
$$= 0.10.$$

Accordingly, the temperature of the air discharged by the CPU cooler may only be slightly greater than the temperature of the surrounding ambient air, even if the CPU is running very hot. The above calculation is informative because it suggests a great deal of room for improvement in the efficiency of the air-heat-sink interaction. To address this issue, what is needed is a method for substantially reducing the thickness of the heat sink boundary layer without incurring substantial penalties in electrical power consumption, size, weight, cost, complexity, etc.

In addition to improving the efficiency of the air-heat-sink interaction, particular embodiments are directed to increasing the volumetric flow rate of air through the heat exchanger. For devices based on the standard HSPF architecture, the flow rate of air may be limited by the electrical power consumption of the fan. In principle, the flow rate can always be increased by increasing the speed of the fan, but as before, running the fan at high rpm involves a tradeoff with respect to electrical power consumption that quickly becomes very unfavorable (cf. Bleier, F. P., *Fan Handbook, Selection, Application and Design*, McGraw-Hill, New York, 1997).

Figure 3:
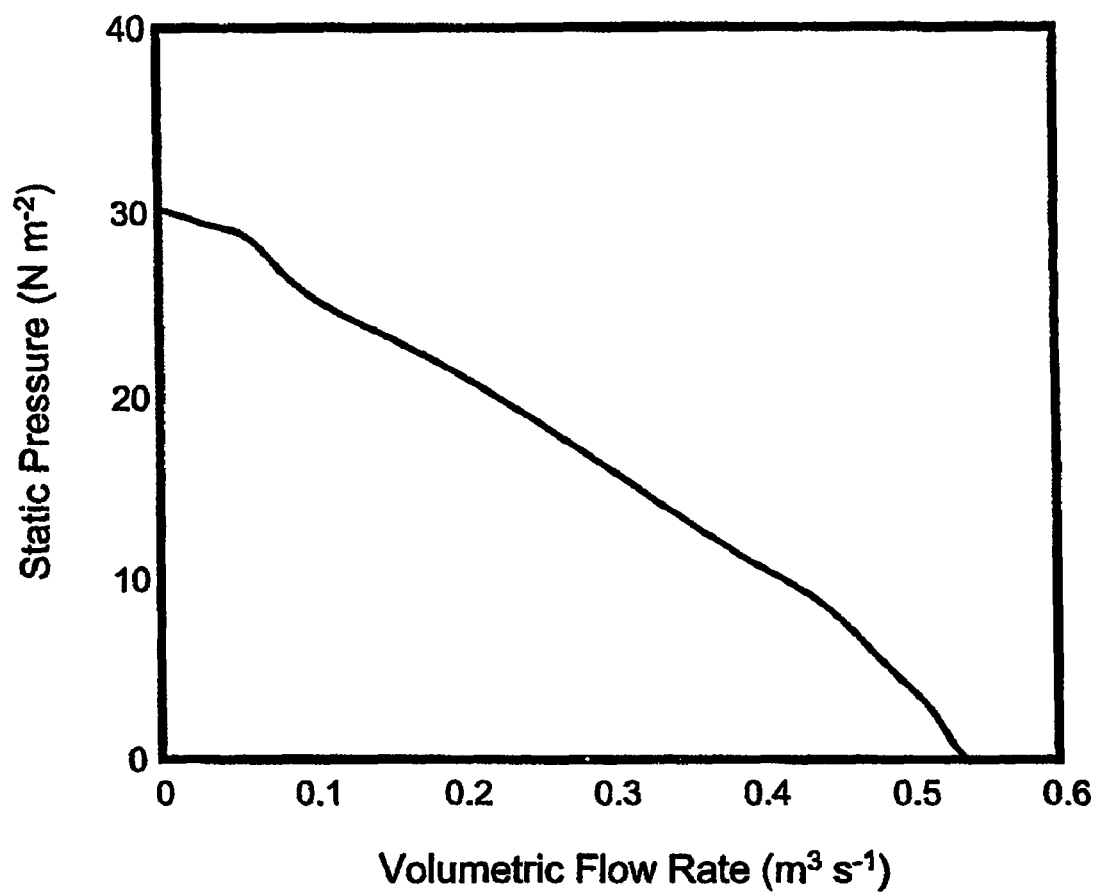
FIG. 3 shows the pressure-flow curve of a 60-mm-diameter, 4800 rpm, cooling fan typical of those used for cooling the CPU of a personal computer.

To better understand the role of fan performance, it can be informative to consider, in absolute terms, the mechanical efficiency of a fan. Here, mechanical efficiency of a fan may be expressed as the kinetic energy imparted to the airflow per unit time, divided by the mechanical energy delivered to the fan rotor per unit time. The power required to force air through a flow restriction is determined by the pressure drop across the flow restriction and the volumetric flow rate. Using the concept of "p-V work" we can think of the fan's output in terms of "p-$\Phi$ power", where p is the pressure delivered by the fan, and $\Phi$ is the volumetric flow rate delivered by the fan (cf. Fox, R. W. and McDonald, A. T., *Introduction to Fluid Dynamics*, 4th edition, John Wiley & Sons, New York, 1992). The mechanical efficiency of a fan may thus be expressed as:

$$\varepsilon_{mech,fan} = \frac{P_{mech,flow}}{P_{mech,motor}} = \frac{p_{fan}\Phi_{fan}}{\varepsilon_{motor}P_{elec,motor}} = \frac{p_{fan}\Phi_{fan}}{\varepsilon_{motor}V_{motor}I_{motor}},$$

where $P_{mech,flow}$ is the mechanical power contained in the flowing air stream generated by the fan, $P_{mech,motor}$ is the mechanical power available at the motor shaft, $\varepsilon_{motor}$ is the electrical- to mechanical conversion efficiency of the motor, $P_{elec,motor}$ is the electrical power delivered to the motor, $V_{motor}$ is the D.C. or rms voltage delivered to the motor, and $I_{motor}$ is the D.C. or rms electrical current delivered to the motor. FIG. 3 shows a pressure/flow curve for a 60-mm-diameter axial fan typical of those used in CPU cooling applications. The pressure/flow curve of such fans is typically an approximately straight line of the form:

$$p(\Phi) = p_{max}\left(1 - \frac{\Phi}{\Phi_{max}}\right).$$

The p($\Phi$) curve has a maximum efficiency operating point at which the product of $\Phi$ of p is maximized:

$$p = \frac{1}{2}p_{max}$$

and $$\Phi = \frac{1}{2}\Phi_{max}.$$

An estimate of the maximum efficiency is therefore:

$$\varepsilon_{mech,fan} = \frac{p_{fan}\Phi_{fan}}{4\varepsilon_{motor}V_{motor}I_{motor}}.$$

For the 60-mm-diameter, 4800-rpm, cooling fan represented in FIG. 3, under typical operating conditions, the mechanical efficiency of the fan is, therefore, about 2.0%:

$$\varepsilon_{max} = \frac{(30\ Nm^{-2})(0.53\ m^2 min^{-1})}{4(0.95)(12V)(0.30A)(60\ smin^{-1})} = 0.020.$$

Figure 4:
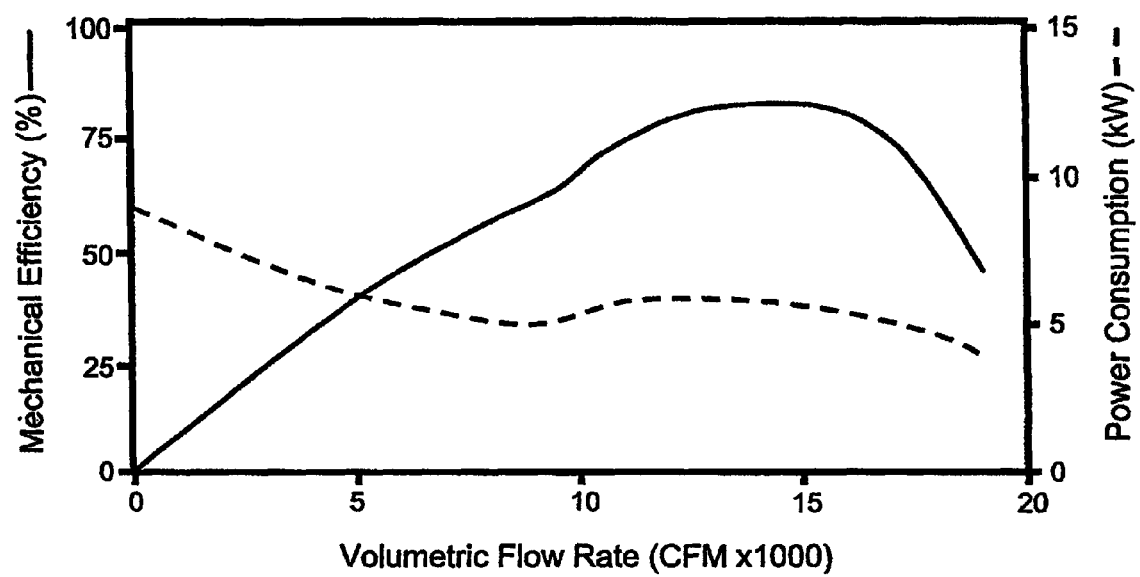
FIG. 4 shows a plot of mechanical efficiency and power consumption as a function of the volumetric flow rate capacity of a vane-axial fan.

This is characteristic of the small-area, high-speed fans used for cooling of electronics and other small devices. Of the mechanical power available at the motor shaft, only 2% is typically imparted to the airflow generated by the fan; the other 98% of the mechanical power generated by the electric motor is wasted on fan-blade viscous drag (at operating speed, the mechanical resistance of the fan motor bearings is negligible compared to the total drag force exerted on the fan blades). This large unproductive expenditure of mechanical energy is also the primary source of fan noise. As shown in FIG. 4 (reproduced from R. Jorgensen, *Fan Engineering*, 7th edition, Buffalo Forge Company, Buffalo, N.Y., 1970), much larger, lower-rpm fans achieve far better mechanical efficiency, as high as 80% for large industrial fans that consume in excess of 5 kW of electrical power. But these much larger fans greatly exceed the size, weight and power consumption constraints of many applications (e.g., thermal management of a CPU in a desktop personal computer).

An important implication of the above calculation is that the specific cooling capacity of the CPU cooler falls far short of what is physically possible. A mechanical efficiency of 2.0% implies that in principle, there is as much as a factor of 50 to be gained through design improvements. We therefore conclude that in addition to boundary layer effects, the performance limitations of the HSPF device architecture derive from the intrinsically low efficiency of small, high-speed fans (as does the substantial amount of audible noise generated by such devices). Because of these limitations an improvement in this technical area would seem to be needed.

Further progress in forced air heat exchanger technology could be achieved by the development of a new device architecture with far less intrinsic vulnerability to these two physical effects. In particular, some of the embodiments described herein seek to provide an efficient means for removing waste heat from a thermal load by significantly reducing the boundary layer effects associated with conventional HSPF technology, and by mitigating the problem of low efficiency associated with small, high-speed turbo-machinery.

Figure 5:
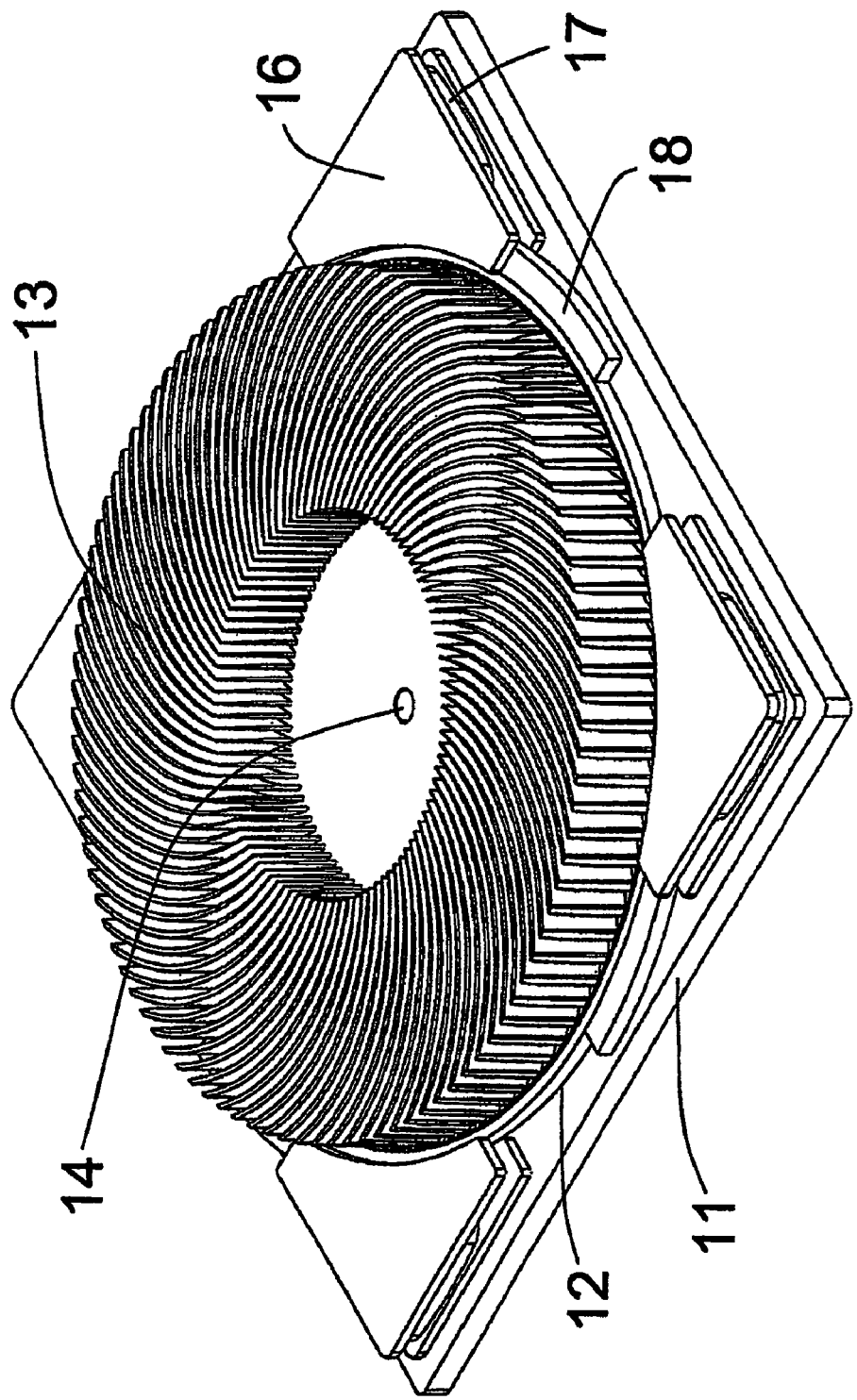
FIG. 5 shows a representative embodiment in the form of an isometric line drawing.
Figure 6:
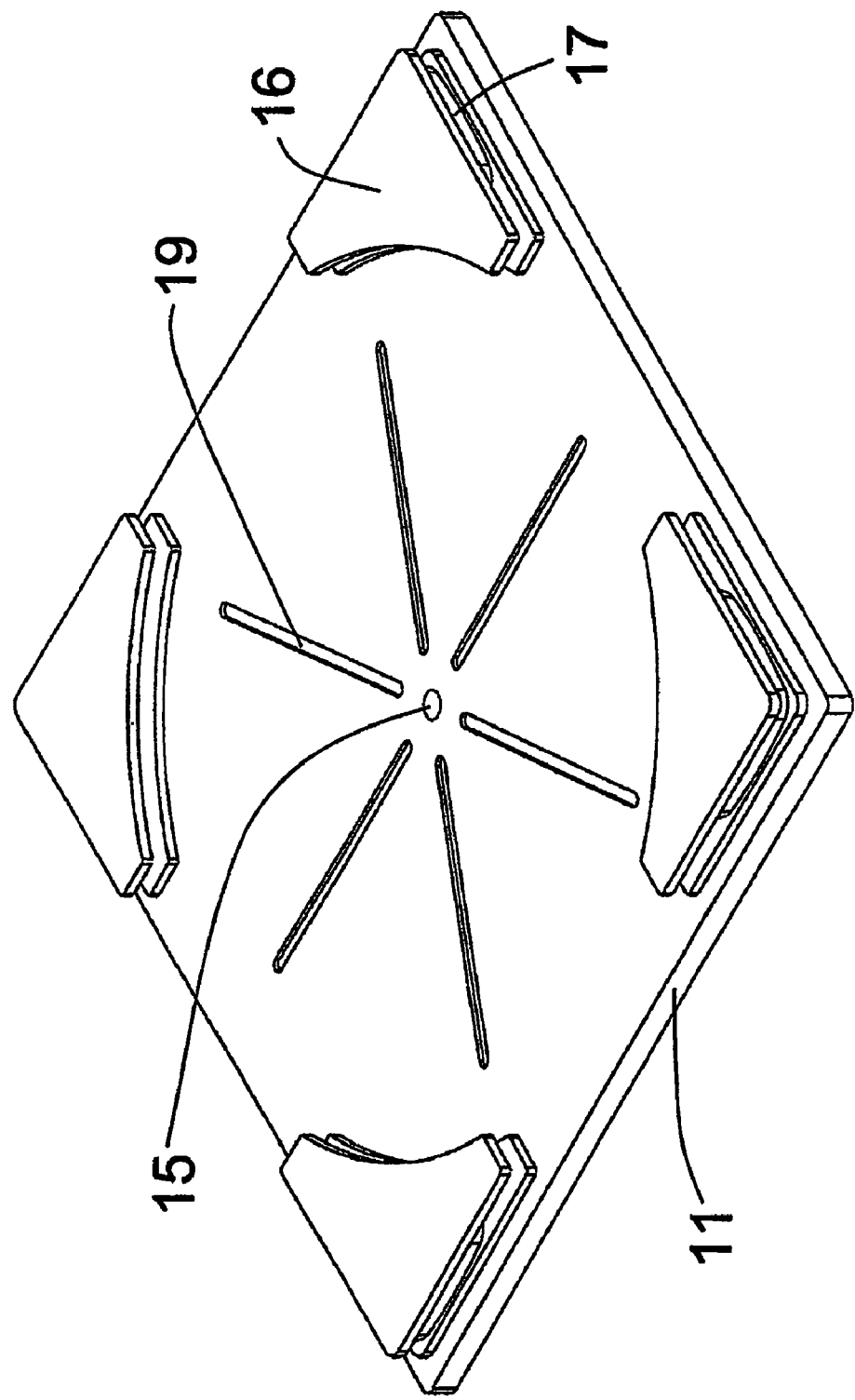
FIG. 6 shows the representative embodiment of FIG. 5 with the heat-sink-impeller omitted, in the form of an isometric line drawing.

Disclosed herein is a new architecture for an air-cooled heat exchanger that uses an efficient scheme for circulating air through heat exchanger fins and also incorporates an effective mechanism for reducing the boundary layer thickness. One representative embodiment of this new device architecture is illustrated in FIGS. 5 and 6. Various other objects and advantages will be more readily understood from the description when read in conjunction with the appended drawings. The following description is intended to be exemplary and explanatory only to provide further explanation of the embodiments and principles described in this application. The accompanying drawings are included to illustrate and provide a further understanding of the embodiments described herein, and are incorporated in and constitute part of this specification. The scope of the embodiments should be determined by appended claims and their legal equivalents, rather than by the examples given.

Referring to FIG. 5, throughout the discussion that follows, the term "z-axis" will be used to refer to an axis of rotation of the heat-sink-impeller-structure 13, the term "x-y plane" will be used to denote any plane substantially parallel to the plane of the base plate 11, and the term "azimuthal" will be used to refer to circular motion about the z-axis and parallel to the x-y plane. Terms such as the "bottom" and "top" surfaces of the base plate and heat-sink-impeller structure correspond to the device orientation shown FIGS. 5 and 6.

Herein, the term "thermal load" may be interpreted to mean any object or objects to which, or from which, heat may be transferred. Examples of thermal loads include a device that may generate waste heat (such as a CPU), a device that may be used to transfer heat to or from such a device (such as a heat pipe), a "cold side" or "hot side" of a heat pump or heat engine, and any combination and/or plurality of such thermal loads. Herein, the term "thermal contact" shall be interpreted to mean that two objects are in thermal contact with each other if heat can flow readily between the two objects. For example, if the mechanism of heat flow is conduction, "thermal contact" indicates that there is a path for conductive heat flow between the two objects with substantially low thermal resistance. However, this is merely an example of two objects in thermal contact, and claimed subject matter is not limited in this respect. Note that thermal contact between two objects does not require that the two objects be in physical contact (i.e. touching). For example, a thermal load and heat sink separated by a layer of high-thermal-conductivity heat sink paste are in thermal contact, even though they are not in physical contact. Herein, two objects in thermal contact may also be referred to as "thermally coupled". Throughout this discussion herein, unless otherwise defined, the term "heat sink" should be interpreted to mean a structure providing substantially high internal thermal conductivity and a surface area for transfer of heat to or from a surrounding medium (e.g., air, mixtures of gases other than air, pure gases, fluids, etc.).

Referring to the particular implementation of FIGS. 5 and 6, heat from a thermal load enters a base plate 11 through a surface facing the thermal load, flows through the interior region of base plate, across an air gap 12 between abutting surfaces of the base plate 11 and heat-sink-impeller structure 13, into an interior region of the rotating heat-sink-impeller structure, and is then deposited into the air that circulates through the impeller fins. Base plate 11 may also act as a heat spreader in applications in which a thermal load is concentrated in a small area and/or is otherwise distributed unevenly. The heat-sink-impeller structure 13 may rotate at high speed and function as both a heat sink and a centrifugal pump. There is no need for a fan in this particular embodiment. Here, air is drawn in the downward direction near the center of rotation and then expelled radially through impeller blades.

As illustrated in FIGS. 5 and 6, a rotating heat sink structure is supported by an air bearing that prevents the structure from coming into physical contact with the base plate during operation. The heat-sink-impeller structure may be kept centered on the base plate by the attractive interaction of a rare earth magnet 14 incorporated into the heat-sink-impeller structure, and a second rare earth magnet 15 (visible in FIG. 6) embedded in the base plate. These magnets may also allow the device to be operated upside down, or in an arbitrary orientation. The rotation mechanism comprises a variable reluctance motor in which stator cores 16, stator core windings 17, and rotor teeth 18 may be incorporated directly into the base-plate-impeller assembly.

Figure 7:
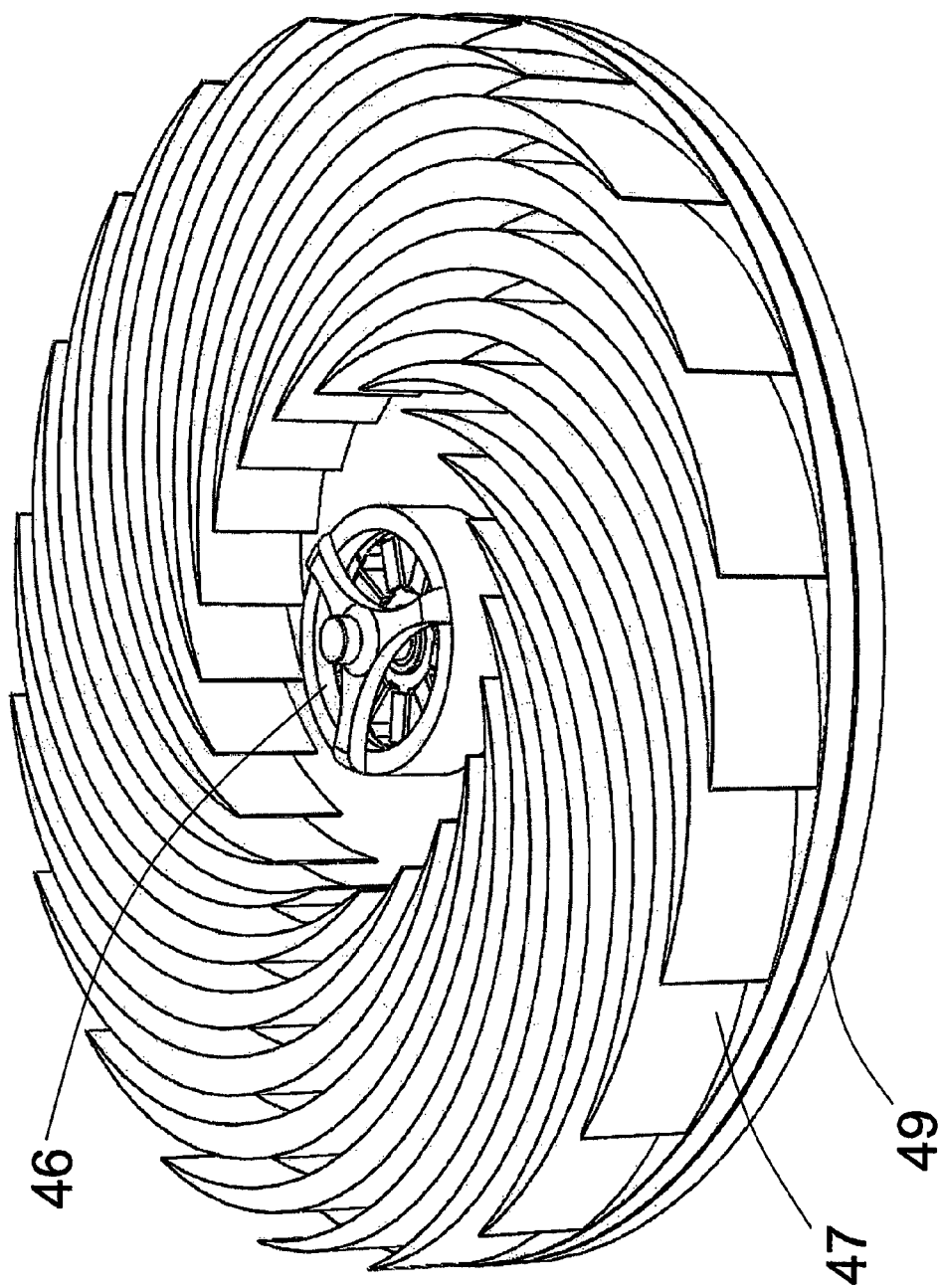
FIG. 7 shows another representative embodiment in the form of an isometric line drawing.

FIG. 7 shows an isometric line drawing of another embodiment. The motor assembly 46 of FIG. 7 may be located inside, rather than peripheral to, the heat sink structure 47. In other embodiments, the motor assembly may be positioned in other locations. Generally, a stator of the motor assembly 46 may be affixed to a base plate 49 and a rotor of the motor assembly 46 may be coupled to the heat sink structure 47 to cause rotation or other movement of the heat sink structure relative to the base plate.

Figure 8:
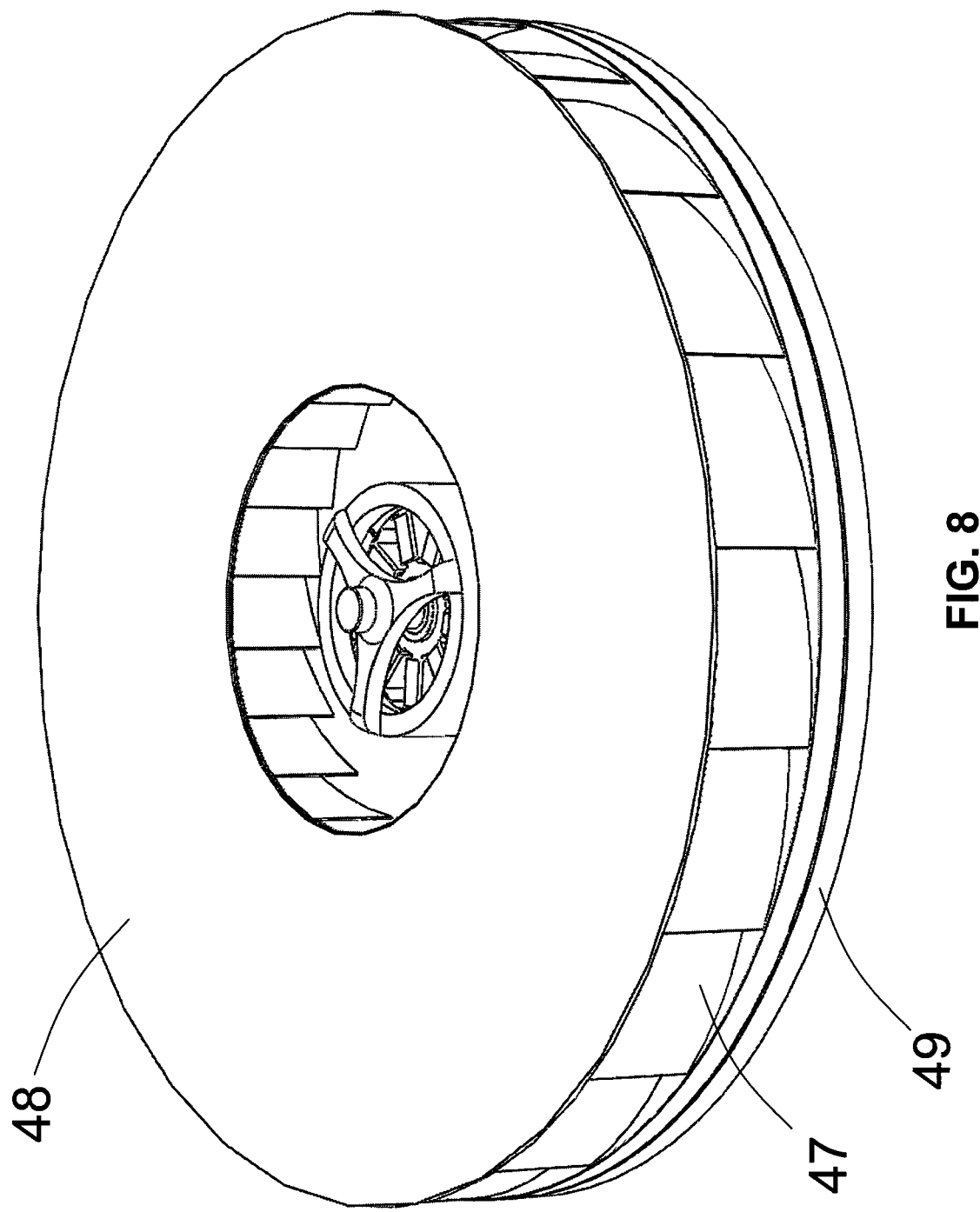
FIG. 8 shows another representative embodiment in the form of an isometric line drawing.

FIG. 8 shows an isometric line drawing of the assembly of FIG. 7 including a shroud 48. The shroud 48 may be positioned to direct air flow in and around the heat sink structure 47. So, for example, the shroud 48, positioned as shown in FIG. 8 may reduce airflow in an upward direction as shown, while allowing air flow through fins of the heat sink structure 47. The shroud 48 may be coupled directly to the heat sink structure 47 and may rotate or otherwise move during operation in a similar manner as the heat sink structure 47. In other embodiments, however, the shroud may resemble more of a cover, and may not be directly attached to the heat sink structure 47 and may not move during operation. In embodiments where the shroud 48 is thermally coupled to the heat sink structure 47, it may advantageously provide additional surfaces for heat transfer to a surrounding environment.

Figure 9:
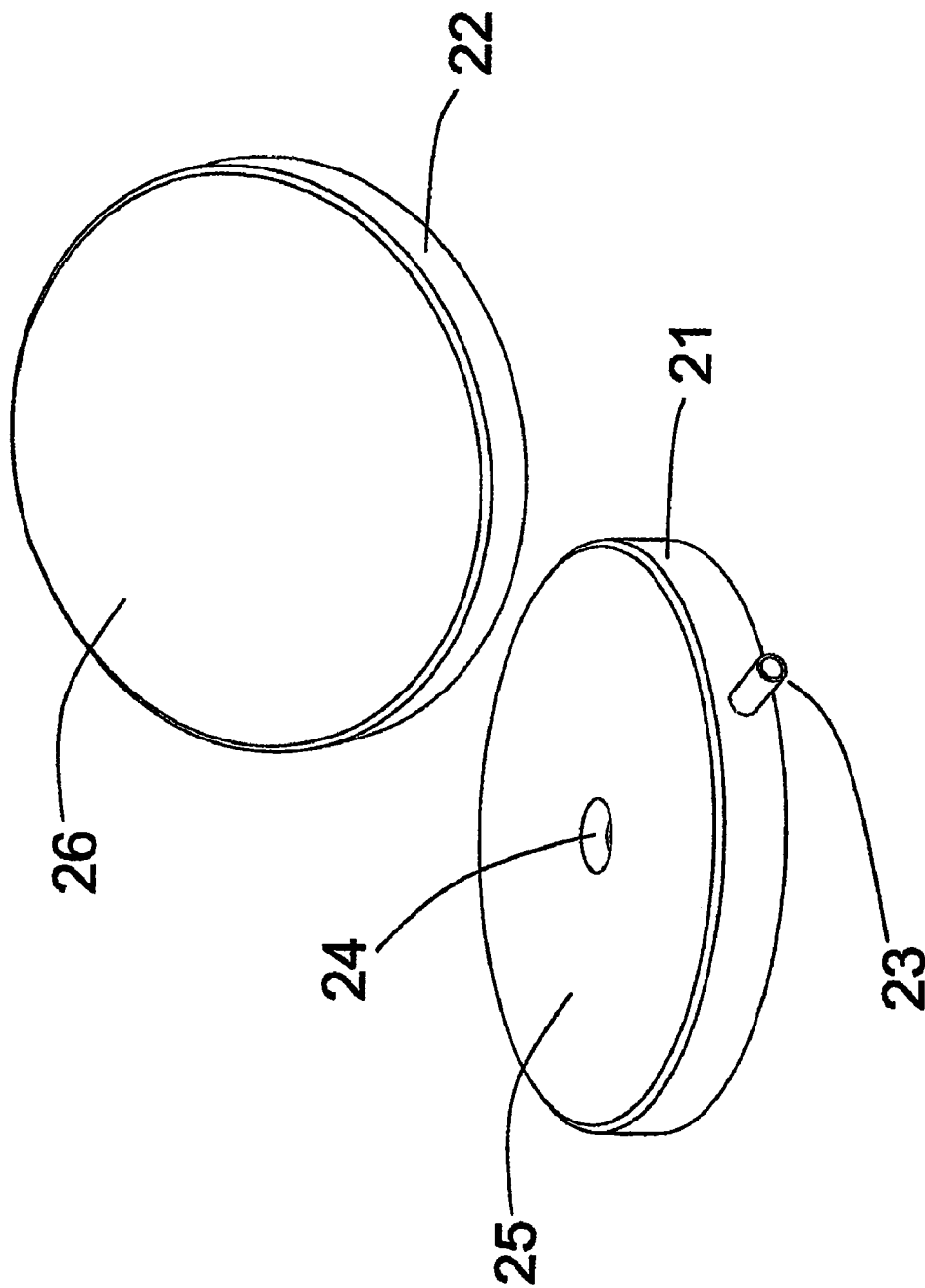
FIG. 9 shows an example of a commercially available air bearing.

FIG. 9 shows a type of air bearing that may be used in a particular implementation. Such a hydrostatic (externally pressurized) air bearing may comprise one of several air bearing assemblies such as those sold by New Way Air Bearings (Ashton, Pa., www.newwayairbearings.com). At lower left in FIG. 9 is the air bearing "pad" 21, and at upper right in FIG. 9 is the air bearing "puck" 22. An input port 23 delivers compressed air to an output orifice 24. During operation, the mating surface of the air bearing pad and the mating surface of the air bearing puck (25 and 26, respectively) are separated by a thin cushion of compressed air. The compressed air flows from the orifice 24, in the radial direction through the narrow air gap region defined by surfaces 25 and 26, and is then discharged at the perimeter of the air bearing assembly. In the representative embodiment illustrated in FIGS. 5 and 6, base plate 11 serves as the air bearing pad and the rotating, finned heat sink 13 serves as the air-bearing puck. An ultra-low-friction interface between the rotating heat-sink-impeller structure and base plate is analogous to that of an air hockey puck and air hockey table. During operation, the thickness of the air layer 12 that separates the stationary base plate and the rotating heat-sink-impeller structure is on the order of 5 μm, comparable to that of commercial air bearings.

In the representative embodiment illustrated in FIGS. 5 and 6, a hydrodynamic (sometimes referred to as a "self-pressurizing air bearing"), rather than a hydrostatic, air bearing is used. The use of a hydrodynamic air bearing can eliminate the need for an external source of compressed air. In such a hydrodynamic bearing, a small portion of mechanical power transmitted to the rotating structure may be used to generate the required film of air between the rotating and stationary surfaces (cf. G. W. Stachowick and A. W. Batchelor, *Engineering Tribology*, 3rd edition, Elsevier Butterworth-Heinmann, Burlington, Mass., 2005).

Operation of a hydrodynamic bearing may be considered analogous to hydroplaning of a car tire on wet pavement when a vehicle is traveling at high speed. At low speed, hydroplaning does not occur because the water that accumulates in front of the tire as it travels in the forward direction is excluded from the region of contact between the pavement and the tire; a portion of the water flows around the tire, and a portion of the water flows through the grooves of the tire tread. If the vehicle is traveling fast enough, however, the flow rate of water impinging on the front of the tire exceeds the amount of water that can flow around the tire and through the grooves of the tire tread. Under these conditions, a wedge-like film of water builds up underneath the tire tread, and lifts the tire off of the surface of the road. With the pavement and tire tread no longer in physical contact, traction drops precipitously. In a conventional hydrodynamic bearing, a similar effect may be exploited to create a low-friction bearing between two surfaces that move relative to each other.

The type of hydrodynamic air bearing used in the representative embodiment illustrated in FIGS. 5 and 6 is sometimes referred to as a "Rayleigh Step Bearing", and comprises a series of radial grooves 19 (visible in FIG. 6) inscribed into the top surface of the base plate 11. During operation, air is pumped in the azimuthal direction between successive grooves by viscous interaction with the bottom surface of the rotating heat-sink-impeller structure 13. Air flow in the azimuthal direction between successive grooves 19 may enable separation of the stationary and rotating surfaces; if the speed of rotation is high enough, static air pressure generated by the series of radial grooves may be sufficient to lift the heat-sink-impeller structure and cause separation of the stationary and rotating surfaces.

The presence of radial grooves in the top surface of the base plate results in a small reduction in the area for the narrow air gap region. Although this may increase the thermal resistance of the air gap region, it is a very small effect. It is also important to note that turbulence generated in the grooved hydrodynamic air bearing structure is expected to enhance convective heat transfer between base plate 11 and heat transfer structure 13.

One property of air bearings is that the air gap distance, while very small, is self-regulating. If we consider operation of the device shown in FIGS. 5 and 6 in the "right-side-up" orientation, the upward force exerted by the air bearing may be balanced by the downward force exerted by the magnetic field, and to a much lesser extent, the force of gravity (even for the very small cylindrical rare earth magnets used for the device shown in FIGS. 5 and 6, which are 0.125" in diameter and 0.100" in length, magnetic force may be approximately a factor of ten larger than the gravitational force). An equilibrium air gap distance is determined by the flow rate of air through the air gap region and the strength of the magnetic force. Instead of attempting to maintain a ~5 μm air gap by holding extremely tight mechanical tolerances, particular embodiments rely on built-in negative feedback between the air gap distance and the air gap pressure force.

In qualitative terms, the manner in which an air gap may be automatically stabilized by negative feedback may be readily explained. A more subtle point is that in quantitative terms, air bearings may provide extremely high stiffness. The effective "spring constant" of an air bearing may be very large because the equilibrium air gap pressure is an extremely sensitive function of air gap distance; the spring constant may be defined as dF/dh, where F is the pressure force acting on the bottom surface of the heat-sink-impeller structure and h is the air gap distance. For the device shown in FIGS. 5 and 6, in particular, the embodiments comprising rare earth magnets 14 and 15 may make the effective weight of the 100 gm heat-sink-impeller structure 13 1.0 kg. The magnetic force may be considered approximately constant for a small displacement in the z direction if the air gap distance is orders of magnitude smaller than the extent of the magnetic field in the x-y plane.

However, there is an approximately third-order relationship between air gap distance and pressure force. This may imply that a variation in displacement over a range 5±1 μm should result in a change in pressure force of roughly ±50%. For the device shown in FIGS. 5 and 6, this may translate to a spring constant of approximately 5 N/μm. The force of 1 g acceleration acting on a 100 gm heat-sink-impeller structure is approximately 1 N. It is therefore expected that an acceleration of 10 g along the z-axis may only result in a displacement of order 2 μm. Although it is well known that air bearings may provide ultralow friction performance, the very high mechanical stiffness that may be realized with air bearings plays an important role in many applications.

Another quantitative assessment that may be made regarding the use of an air bearing concerns power that may be expended to levitate a heat-sink-impeller structure. For a hydrostatic air bearing, the power expended to force air through the flow restriction of the gap region may be the product of the pressure drop across this flow restriction and the volumetric flow rate. Equations for pressure and volumetric flow rate for a hydrostatic air bearing such as that shown in FIG. 9 are (cf. Whitney, W. M., *Theory of the Air-Supported Puck*, Amer. J. Physics, Vol. 32, No. 4, pp. 306-312, 1964):

$$p = \frac{m_{eff} g}{\pi(b^2 - a^2)} \ln\left(\frac{b}{a}\right)$$

$$\Phi = \frac{m_{eff} g h^3}{3\mu(b^2 - a^2)},$$

where p is pressure, $\Phi$ is volumetric flow rate, $m_{eff}$ is the effective mass of the puck (associated with the combined magnetic and gravitational forces), g is the gravitational acceleration constant, b is the outer radius of the heat sink puck, a is the radius of the approximately isobaric region defined by the orifice, ρ is the density of air, h is the air gap distance, and μ is the dynamic (or absolute) viscosity of air. For the device shown in FIGS. 5 and 6, we calculate a pressure and volumetric flow rate of:

$$p = \frac{(1.0 \text{ kg})(9.8 \text{ Nkg}^{-1})}{\pi[(4.6 \times 10^{-2} \text{ m})^2 - (5.0 \times 10^{-3} \text{ m})^2]} \ln\left(\frac{4.6 \times 10^{-2} \text{ m}}{5.0 \times 10^{-3} \text{ m}}\right)$$

$$= 3.3 \times 10^3 \text{ Nm}^{-2},$$

and:

$$\Phi = \frac{(1.0 \text{ kg})(9.8 \text{ Nkg}^{-1})(5.0 \times 10^{-6} \text{ m})^3}{3(1.8 \times 10^{-5} \text{ Nm}^{-2}\text{s})[(4.6 \times 10^{-2} \text{ m})^2 - (5.0 \times 10^{-3} \text{ m})^2]}$$

$$= 1.1 \times 10^{-8} \text{ m}^3\text{s}^{-1}.$$

The power required to operate the air bearing, therefore, is negligible (e.g., compared to the power consumption of even the smallest commercially available brushless motor fans):

$$P = p\Phi = (0.3 \times 10^3 \text{ Nm}^{-2})(1.1 \times 10^{-8} \text{ m}^3\text{s}^{-1}) = 3.6 \times 10^{-5} \text{ W}.$$

This small number results from the fact that the air gap distance is extremely small compared to the distance over which the air must flow to escape from underneath the heat-sink-impeller structure, and the fact that the upward pressure force exerted by the air acts over a relatively large area.

In the case of a hydrodynamic air bearing, an estimate of the power consumption can be determined directly from a bearing coefficient of friction, which may be calculated theoretically, but which may be more accurately measured experimentally. Such experimentally measured coefficients of friction for a wide variety of hydrodynamic air bearings are typically extremely low compared to the coefficients of friction for comparably sized ball bearing assemblies (cf. Fuller, D. D., "A Review of the State-of-the-Art for the Design of Self-Acting Gas-Lubricated Bearings," *Journal of Lubrication Technology*, Vol. 91, pp. 1-16, 1969). Accordingly, the power consumption of implementation of such hydrodynamic air bearings may be extremely low.

In particular implementations, a hydrodynamic air bearing may include a provision for startup and shutdown since a hydrodynamic lifting force may only be generated if the heat-sink-impeller is rotating. In one implementation, sliding contact between surfaces of a base plate and heat-sink-impeller structure may be allowed for a few seconds while a motor is turned "on" or "off". This technique may be applicable to hydrodynamic air bearings that have a large surface area and carry a light load, especially if the particular application does not require a motor to be repeatedly switched on and off during normal operation. The use of an anti-friction coating and/or lubricant film may be provided in such air bearing systems.

If cumulative wear associated with occasional sliding contact between surfaces of a base plate and heat-sink-impeller structure is deemed objectionable, a mechanism may be introduced that may be used to provide an auxiliary levitation force during startup and shutdown. For example, in the representative embodiment illustrated in FIGS. 5 and 6, one approach would be to configure the stator/rotor tooth geometry to provide a magnetic force component perpendicular to the plane of rotation. During startup and shutdown a large D.C. bias current may be applied to the stator coils to generate a lifting force. Such a D.C. bias current may be made much larger than the normal rms operating current of the motor without overheating the stator windings because it may only be applied for a brief interval.

From the standpoint of the prior art, the idea of intentionally introducing an air gap between a thermal load and heat sink structure would appear to be ill-advised; much of the prior art is concerned with materials and techniques for bonding the thermal load and metal heat sink together in a manner that creates a solid, low-thermal-resistance joint, completely free of voids. Such thermal interface technology continues to be an active area of research. Moreover, it is well known that the thermal bottleneck for heat flow in conventional HSPF devices is the thin insulating film of boundary-layer air that envelopes the surfaces of the finned heat sink. Thus in qualitative terms, the argument that the introduction of an air gap would be counter-productive due to the very poor thermal transport properties of air may be considered convincing and/or obvious. But particular embodiments described herein employ unique properties of gas bearings and lead to an entirely different conclusion, especially if a quantitative analysis of heat transfer in a gas bearing structure is undertaken.

For example, for the particular embodiment illustrated in FIGS. 5 and 6, the thermal resistance across the planar air gap 12 may be made very small, $\leq 0.03$ K W$^{-1}$. An absolute upper limit for the thermal resistance of the air gap region can be calculated by assuming that the air residing in the gap region is completely motionless. In the system shown in FIGS. 5 and 6, according to a particular embodiment, the diameter of the heat-sink-impeller structure is 3.6" (0.092 m) and the air gap distance is 5.0 μm. For an air gap of these dimensions, a worst-case value of the thermal resistance ($R_{air\ gap}$) may be given by:

$$R_{air\ gap}(worst\ case) = \frac{d_{air\ gap}}{k_{air}A_{air\ gap}}$$

$$= \frac{(5.0 \times 10^{-6}\ m)}{\pi(0.025\ Wm^{-1}K^{-1})(0.046\ m)^2}$$

$$= 0.030\ KW^{-1}.$$

This is about a factor of ten lower than the thermal resistance of the high-performance commercially available CPU coolers discussed earlier. It should be understood that this illustration with specific dimensions and measurements is merely an example of a particular implementation and that claimed subject matter is not limited in this respect.

Moreover, the thermal resistance of such an air gap region may actually be considerably lower (e.g. <0.01 K/W) due to violent shearing of the air flow between the top surface of the stationary base plate and the bottom surface of the rapidly rotating heat-sink-impeller structure (cf. Tennekes, H. and Lumley, J. L., *A First Course in Turbulence*, The MIT Press, Cambridge, Mass., 1972), due to the convective flow generated by the radial grooves of the hydrodynamic air bearing (cf. Faria, M. T. C. and Andres, L. S., "On the Numerical Modeling of High-Speed Hydrodynamic Gas Bearings", *Journal of Tribology*, Vol. 122, No. 1, pp. 124-130, 2000), and/or additional structures such as surface protuberances adapted to generate turbulence and/or convection in the air gap region.

The prior art in the field of thermal management technology teaches away from the use of air gaps and other such equivalent structures to provide a low-thermal resistance joint (e.g., between a heat sink and a thermal load). As alluded to earlier, one reason for this may be considered obvious; commonly available fluids such as water or oil have thermal transport properties that are far superior to gaseous media (e.g., higher thermal conductivity by a factor of 100). Such fluid media may therefore be assumed suitable for an application such as the transport of heat from a stationary heat conducting structure to a rotating heat transfer structure. Moreover, the prior art does not anticipate the extent to which the obvious disadvantage of low thermal conductivity might be offset by the numerous other advantages conferred by use of a gaseous medium in such an application (e.g., extremely low frictional losses at high rotational speed).

An objective of the embodiments described herein is to avoid the numerous and very serious drawbacks that may be associated with the use of a liquid heat transfer interface. Some of the most serious drawbacks are related to the fact that the absolute viscosities of such liquids are typically on the order of 1,000 to 10,000 times that of air (cf. Fox, R. W. and McDonald, A. T., *Introduction to Fluid Dynamics*, 4$^{th}$ edition, John Wiley & Sons, New York, 1992). As a result, viscous shearing of a heat transfer fluid may generate a substantial quantity of heat. These frictional losses may be especially large when attempting to rotate a heat transfer structure at high speed, which may be critical to obtaining low thermal resistance between such a rotating heat transfer structure and a surrounding medium, such as air. High frictional losses may also be very undesirable from the standpoint of electrical power consumption.

The use of any such heat transfer liquid may also present several practical problems. The first of these is fluid containment. Centrifugal pumping force acting on the fluid in the radial direction, the need to operate and/or store such a cooling device in an arbitrary orientation (e.g., up-side-down), and issues related to thermal cycling (i.e., repeated expansion and contraction) of the fluid all can contribute to the problem of fluid containment. Possible approaches to mitigating fluid leakage may include increasing the viscosity of the heat transfer fluid and/or incorporating one or more rotary seals. Increasing the viscosity of the heat transfer fluid may be undesirable from the standpoint of frictional heating and electrical power consumption. The incorporation of rotary seals may be undesirable from the standpoint of cost, complexity, reliability, operating lifetime, and further frictional losses. In addition, the implementation of rotary seals may be complicated by the need to operate over a wide range in temperature. A further difficulty may be the tendency for such fluids to degrade over time, due to thermal decomposition, the introduction of contaminants, oxidation, etc. Finally, the steep temperature dependence of the viscosity for such liquids may also present serious practical problems; for example, very high starting torque requirements or seizure of the fluid joint at low temperature.

As noted earlier, a key drawback of the HSPF device architecture is the problem of high electrical power consumption. In a traditional forced-air heat exchanger, the purpose of the fan is to force air to flow through the fins of the heat exchanger. Relative to the power consumption of the fan motor, the amount of power (pressure times volumetric flow rate) required to force the air to flow through the fins of the heat exchanger may be very small. As demonstrated earlier, in a typical CPU cooler only 2% of the mechanical power generated by fan motor may be used for this purpose. The remaining 98% of the mechanical power generated by the fan motor may be expended unproductively on fan-blade viscous drag. In particular embodiments, this unproductive expenditure of power is substantially reduced or eliminated altogether. Moving a finned heat sink structure through the air, rather than moving air through a finned heat sink structure, allows substantially more or substantially all of the mechanical power delivered by the motor to be used for the purpose of generating relative motion between the heat sink fins and the surrounding air. The very low mechanical efficiency of the fans used in devices such as conventional CPU coolers suggests that such a particular device architecture according to an embodiment may allow markedly reduced electrical power consumption, reduced noise, and/or operation at much higher volumetric flow rates. Hereafter, we will refer to such aspects of embodiments described herein (by which the problem of low fan mechanical efficiency is substantially mitigated) as the "direct-drive advantage".

Another key objective of certain embodiments is to mitigate problems associated with boundary layer effects inherent to the HSPF device architecture. In a conventional HSPF device, for example, the Navier-Stokes equations for flow are governed by the pressure-gradient and viscous-drag force terms and conservation of mass (cf. Schlichting H., *Boundary Layer Theory*, McGraw-Hill, New York, 1979). As mentioned earlier, such a boundary layer can be modeled as an insulating layer of air that clings to the surface of the heat sink fins. In particular embodiments, heat sink fins and an envelope of boundary layer air that adheres to the heat sink fins may be placed in an accelerating (rapidly rotating) frame of reference. In the non-inertial, rotating frame of reference of such a heat sink-impeller structure, a volume element of air (dV) residing in the boundary layer may be subjected to an outward centrifugal force of $dF=\rho\omega^2 rdV$, where dF is the force acting on the volume element of air, $\rho$ is the density of air, $\omega$ is the angular velocity of the heat-sink-impeller structure, and r is radial position. This centrifugal pumping force distorts the flow field relative to the case of a non-rotating frame of reference, and in a manner that may reduce the thickness of the boundary layer considerably (e.g., by a factor of ten).

The ramifications of this boundary-layer thinning effect may be very substantial with regard to heat transfer. As discussed earlier, in conventional HSPF devices the difference in temperature between the finned heat sink and ambient air may be almost entirely accounted for by the temperature drop across the boundary layer. In other words, the boundary layer may act as a thermal bottleneck in the series of steps required to transport heat from the thermal load to the surrounding air. The thermal resistance of the boundary layer may be approximately proportional to the boundary layer thickness. A centrifugal pumping effect such as that described above may therefore provide approximately a factor of ten reduction in the thermal resistance of such a boundary layer. Hereafter, we will refer to such aspects of embodiments described herein (in which placement of a boundary layer in an accelerating frame of reference may mitigate the longstanding problem of boundary layer thermal resistance) as the "boundary-layer-thinning effect".

An additional effect that may be of significance at high rotational and/or translational speed concerns a transition from laminar to turbulent flow (e.g., for flow of air between adjacent heat-sink-impeller fins). For example, if the angular velocity of such a heat transfer structure is high enough to induce turbulence over a portion of a flow field proximate to such a heat transfer structure, a reduction in thermal resistance between such a heat transfer structure and a surrounding medium may be realized. Such turbulence effects may result in a reduction in thermal resistance between a heat transfer structure and a heat conducting structure as well. In particular embodiments, such turbulence effects may be adapted to provide enhanced performance of a heat exchanger comprising embodiments described herein. Hereafter, we will refer to such aspects of embodiments described herein (wherein operation of a heat transfer structure, or a portion of such a heat transfer structure, in the turbulent flow regime provides improved heat transfer relative to the case of laminar flow) as the "turbulent-flow effect".

The representative embodiment illustrated in FIGS. 5 and 6 is one of many possible embodiments of a device architecture that may comprise one or more of the following:

1. a heat conducting structure (e.g., "base plate" of the representative embodiment),
2. a heat transfer structure (e.g., "heat-sink-impeller" of the representative embodiment),
3. a gas filled region sandwiched between heat conducting and heat transfer structures,
4. element(s) adapted to impart rotation and/or translation to heat transfer structure,
5. element(s) adapted to control the axis of rotation of heat transfer structure,
6. one or more thermal loads in thermal contact with a heat conducting structure,
7. a surrounding medium to which, or from which, heat may be transferred, and may confer the benefits of the "direct-drive advantage" and/or the "boundary-layer thinning effect" and/or the "turbulent-flow effect", each of which is described above. Note that the above description of the "device architecture" is not meant to be limiting in any way. Rather, it is provided here as a point of reference for the description of alternative embodiments that follows.

Embodiments of an improved device architecture for air-cooled heat exchangers has been described above. Heat from a thermal load may be transmitted to a base plate by conduction through a suitable thermal interface material (e.g., thermally conductive grease), and this base plate functions as a heat spreader from which heat is transmitted from across a gas-bearing interface to a structure that functions as both a finned heat sink and impeller.

Regardless of the heat exchanger device architecture used, the use of a thermal interface material to create a low thermal resistance joint between a heat source and heat sink is widely practiced in the prior art. Such a thermal interface material usually takes the form of thermally conductive grease, paste, adhesive or a thin sheet of highly conformable, thermally conductive material. Without such a thermal interface material, when two solid surfaces are mated to form a joint, because of surface irregularities such as roughness and non-planarity, the area over which actual mechanical contact is achieved may only comprise ~1% of the geometric area of the joint. The purpose of the thermal interface material is to fill in the voids that would otherwise be present with one or more solid, semi-solid, or liquid materials having relatively high thermal conductivity.

Any such thermal joint must accommodate changes in the dimensions of both the heat sink and heat source as a function of temperature. For this reason, it is generally not possible to use an amount of thermal interface material merely equal to the total volume of the voids that would otherwise be present. Rather, a significant quantity of excess thermal interface material is used to create a somewhat thicker thermal joint capable of mechanical deformation to compensate for dimensional changes in the surrounding materials. The search for thermal interface materials with improved properties remains an active area of research because known materials with the appropriate rheological and wetting properties typically have relatively poor thermal conductivity.

Accordingly, another embodiment of the present invention is now described with reference to FIG. 10, directed in part toward eliminating or reducing the need for such a thermal interface material. In the representative embodiment of FIG. 10, a heat-sink-impeller 41 is located in close proximity to the thermal load, an integrated circuit package 42, without the need for a thermal interface material and base plate, as was shown in FIGS. 5 and 6. The heat-sink impeller 41 is one type of a heat transfer structure, as is generally described herein. In other embodiments, other heat transfer structures may be used. As described above, the heat-sink-impeller 41 may be supported by a gas bearing. The low-thermal-resistance interface between the heat source and the heat-sink impeller structure comprises the gas filled gap region 43 between the heat source and the heat-sink-impeller structure FIG. 10 further illustrates such an integrated circuit connected to a circuit board 44 by multiple solder joints 45, as is customary. It should be understood that a wide variety of heat loads other than integrated circuits could be cooled in a similar manner. Similarly, a surface of the integrated surface package 42, a surface of the heat-sink-impeller 41, or both, may define one or more grooves or other textured surface, to facilitate an upward force on the impeller, as described above with reference to FIG. 6.

As described above, a wide variety of means can be used to impart rotation, or other movement, to the heat-sink-impeller structure 41. Generally, as described herein, the heat transfer structure may be rotated or otherwise moved by a motor in some examples. The heat transfer structure, such as the heat-sink-impeller 41, may accordingly serve as or be coupled to a rotor. A corresponding stator structure may be provided to drive the motor. In one embodiment, the means for imparting rotation to the heat-sink-impeller structure may be incorporated directly into the integrated circuit package 42. Such means may include drive circuitry, electromechanical actuators such as stator coils, and one or more components adapted to maintain a substantially constant axis of rotation (as described herein). For example, coils forming all or a portion of a stator structure, e.g. coil of stator structure 102, may be located within the integrated circuit package 42, and may for example be embedded in the integrated circuit chip within the package or in epoxy within the package. The drive circuitry used to operate a motor, e.g. drive circuitry 104, and move the heat-sink-impeller may be incorporated into the integrated circuit within the package 42. In another embodiment, some or all of the means for imparting rotation, or other movement, to the heat-sink-impeller structure may be incorporated into one or more components external to the integrated circuit package. In another embodiment, the heat-sink-impeller may function as the rotor of an induction motor, thereby eliminating the need to incorporate permanent-magnet and/or high-magnetic-permeability materials into the heat-sink-impeller structure.

A number of alternative embodiments are described below in which one or more of the above elements may differ from that shown in the representative embodiment of FIGS. 5, 6, and 10. These alternative embodiments are not intended to be exhaustive, and other variations may occur.

In the representative embodiment shown in FIGS. 5 and 6, a heat conducting structure 11 and/or a heat transfer structure 13 may be made out of MIC6® (Alcoa) aluminum alloy. However, other alloys of aluminum, metals other than aluminum, alloys of metal other than aluminum, or non-metal materials may be used without departing from claimed subject matter. Material features may include high-thermal-conductivity, low-density, high-stiffness, and favorable properties from the standpoint of fabrication, such as machining, casting, polishing, and the like. In small quantities, such structures may be machined out of a solid block of aluminum. For fabrication in large quantities, such a heat conducting structure and/or heat transfer structure may be fabricated as a monolithic die-cast aluminum part in which one or more surfaces may be subsequently subjected to a semi-precision planning/polishing operation. Die cast aluminum may enable low-cost fabrication and may allow the use of alloy formulations with especially high thermal conductivity. Other manufacturing processes, such as investment casting, forging, extruding, rolling, drawing, brazing, chemical milling, etc., may be used in part or whole to fabricate the heat conducting structure without departing from claimed subject matter. Fabrication may also entail finishing operations including but not limited to fly-cutting, grinding, polishing, etc., without departing from claimed subject matter.

Whether fabricated by machining, die-casting, or other techniques, on such a heat transfer structure it may be advantageous to use fins with a tapered cross-section. For example, in the case of die-casting, tapering of the fins in the vertical (z) direction may facilitate removal of the cast part from the mold. In the case of a machined heat transfer structure, fabrication with a tapered end mill may provide a better finish and facilitate chip extraction relative to the case of an untapered end mill. In addition, if during operation the internal heat flux is monotonically decreasing in the z direction, an optimized heat transfer structure may employ some degree of fin tapering in the z direction to eliminate unnecessary, excess material that may otherwise increase weight and drag. Although not shown in FIGS. 5 and 6, fillets at the base of each fin, where each fin intersects the disc-shaped base of the heat-sink-impeller, may also be used. The use of fillets may enhance mechanical strength and facilitate flow of heat between the fins and a disc-shaped base of such a heat transfer structure. Such a heat transfer structure may also incorporate structures such as spars, beams, gussets, fillets, etc., that may increase mechanical rigidity.

In the representative embodiment shown in FIGS. 5 and 6, a heat conducting structure is shown as having a square footprint. Many other shapes could be used without departing from claimed subject matter, however. In the representative embodiment shown in FIGS. 5 and 6, the heat transfer structure has a circular footprint. But many other shapes, such as a regular polygon, could be used. In the representative embodiment, the center of rotation of the heat transfer structure coincides with a center of the heat conducting structure, but this is not a requirement.

The surface finish specification for commercial air bearing components such as those shown in FIG. 9 may be about 0.4 µm rms (root mean square) roughness, although rougher surfaces may be used (cf. *Air Bearing Application and Design Guide*, www.newwayairbearings.com, New Way Air Bearings, Ashton, Pa.). Here, a heat conducting structure and/or heat transfer structure may be machined from precision cast aluminum plate such as MIC6® (Alcoa). The surface roughness specification of MIC6® has a maximum value of 0.5 μm rms and a typical value of ≦0.3 μm rms. Additional characteristics of MIC6® are excellent machinability and high thermal conductivity (142 Wm$^{-1}$K$^{-1}$).

Figure 10:
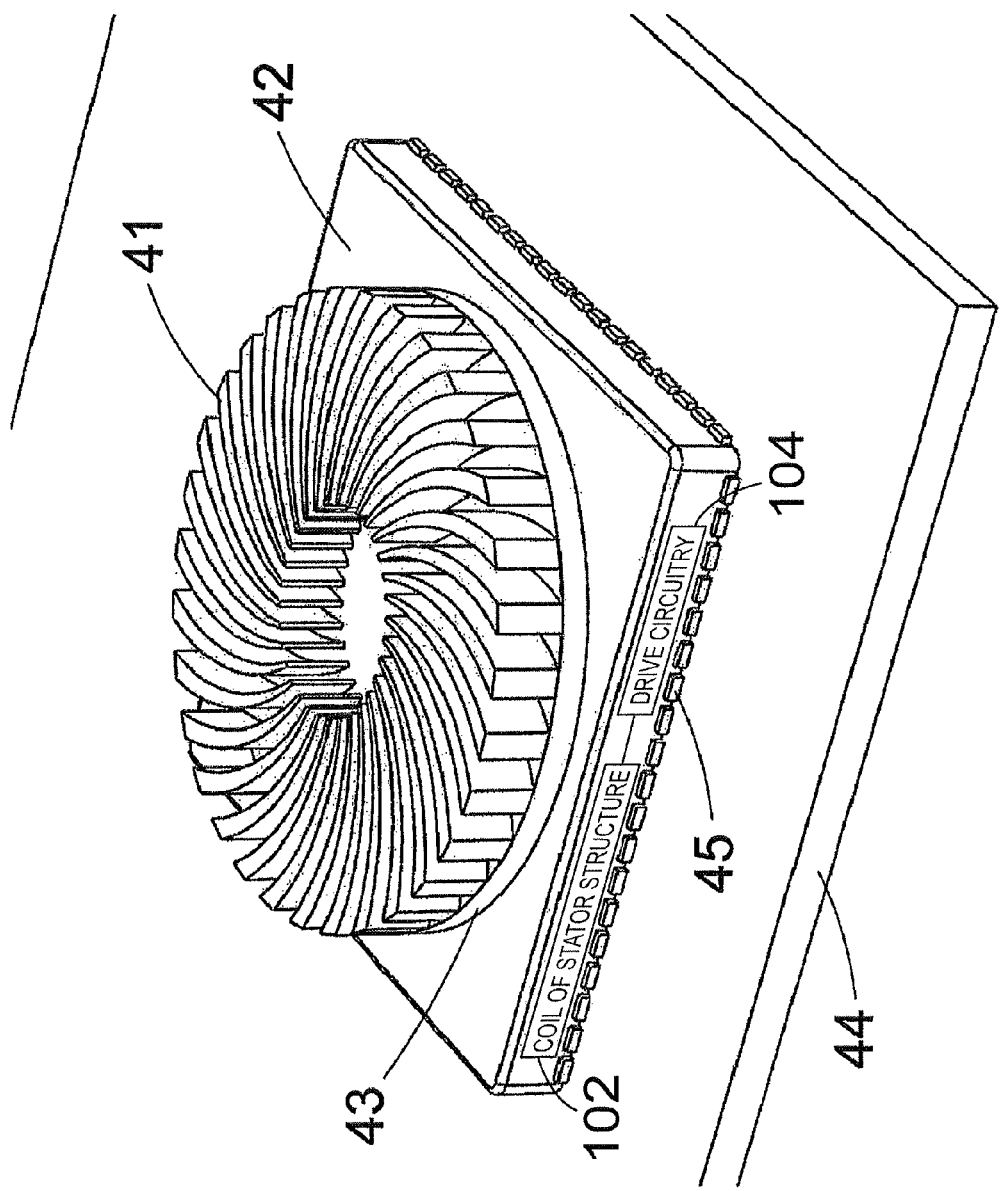
FIG. 10 shows a representative embodiment including an integrated circuit package.

In the representative embodiment shown in FIGS. 5, 6, and 10 surfaces of such a heat conducting structure and/or the heat transfer structure may be uncoated. However, one or more surfaces of such a heat conducting structure and/or the heat transfer structure could be coated to impart desirable attributes such as anti-friction, anti-wear, anti-corrosion, high emissivity, etc., and/or to provide an outer surface more suitable for one or more aspects of a fabrication process, such as polishing.

In the representative embodiment shown in FIGS. 5, 6, and 10 fins of the heat transfer structure take the form of swept, curved blades that project vertically and are designed to function in a manner similar to the vanes of a conventional impeller. However, a wide variety of other geometries could be used without deviating from claimed subject matter, including but not limited to non-curved blades, non-swept (i.e., radial) blades, forward-swept blades, backward-swept blades, blades incorporating curvature in a plane perpendicular to the plane of rotation, blades whose height along the axis of rotation is not constant as of radial position, blades whose cross-sectional area may vary as a function of height and/or radial position, etc., and various combinations thereof. The addition of stiffening members spanning multiple fins, or all of the fins, may be advisable under certain circumstances. However, other structures may be used instead of blades such as fins, pins, posts, vanes, channels, or ducts, or combinations thereof, and any such structure may also be slotted, perforated, textured, segmented, staggered etc. In addition, some of these projecting surfaces may be adapted to generation of wake vortices that interact with other portions of the heat transfer structure.

The extent to which such a rotating heat transfer structure imparts movement to a surrounding medium may vary substantially in different applications. For example, if such a heat transfer structure is similar in structure to an impeller, rotation of such a heat transfer structure may impart substantial motion to the surrounding medium in a manner similar to an impeller. On the other hand, in certain applications it may be desirable to entirely omit features such as blades, fins, posts, and the like, such that the rotating heat transfer structure takes the form of a flat disc or other shape with a smooth top surface.

If the primary objective is heat exchanger performance (e.g., low thermal resistance), the pressure/flow characteristics of a centrifugal pumping effect associated with rotation of such a heat transfer structure may be considered incidental and of no particular importance. But in other applications, design and optimization may be directed at obtaining both good heat exchanger performance, and an ability to force inlet and/or outlet air streams through duct work and/or other such flow restrictions.

For example, we may consider a cooling application such as a commercial data center or server farm, which may take the form of a large room containing hundreds or thousands of computers. Each of these computers may draw in ambient air and discharge it back into the room at elevated temperature. The room air may be kept cool by a large central air conditioning system. Such an air conditioning system may consume a considerable amount of electrical power. Alternatively, a device architecture such as that shown in FIGS. 5 and 6 may be adapted to efficiently extract waste heat from such a thermal load and dispose of it to the outside air without using an air conditioning system.

Figure 11:
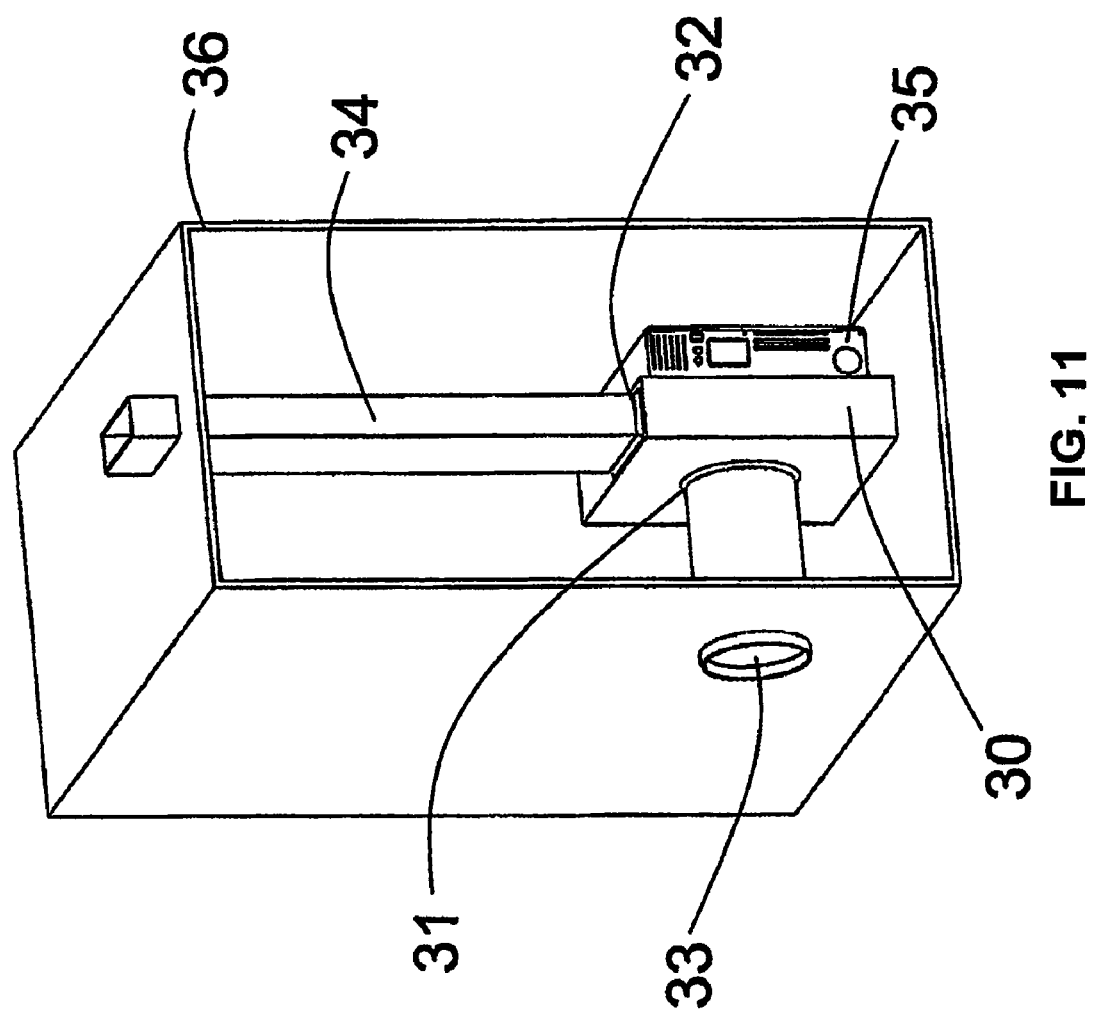
FIG. 11 illustrates a thermal management scheme based on one or more embodiments described herein.

In a thermal management scheme such as that shown in FIG. 11, a heat-sink-impeller may be enclosed in a manifold 30 whose geometry defines an inlet port 31 and an outlet port 32. Such an inlet port may be located above a center of rotation of such a heat-sink-impeller, where air may be drawn down into the impeller. Outside air (e.g., relatively cool air drawn from a location on the north side of a building) may be delivered through an air duct 33 plumbed directly to such an inlet port. Heated air discharged in the radial direction by such an impeller may be routed to such an output port. Such an output port may be plumbed to a second duct 34 that discharges to the outside air (e.g., on the roof of a building). In such a scheme, substantially none of the outside air and very little of the heat generated by the thermal load 35 may enter the building 36. This may substantially reduce or eliminate the need to process the large amount of waste heat generated in such a facility through such a building's air conditioning system.

Figure 12:
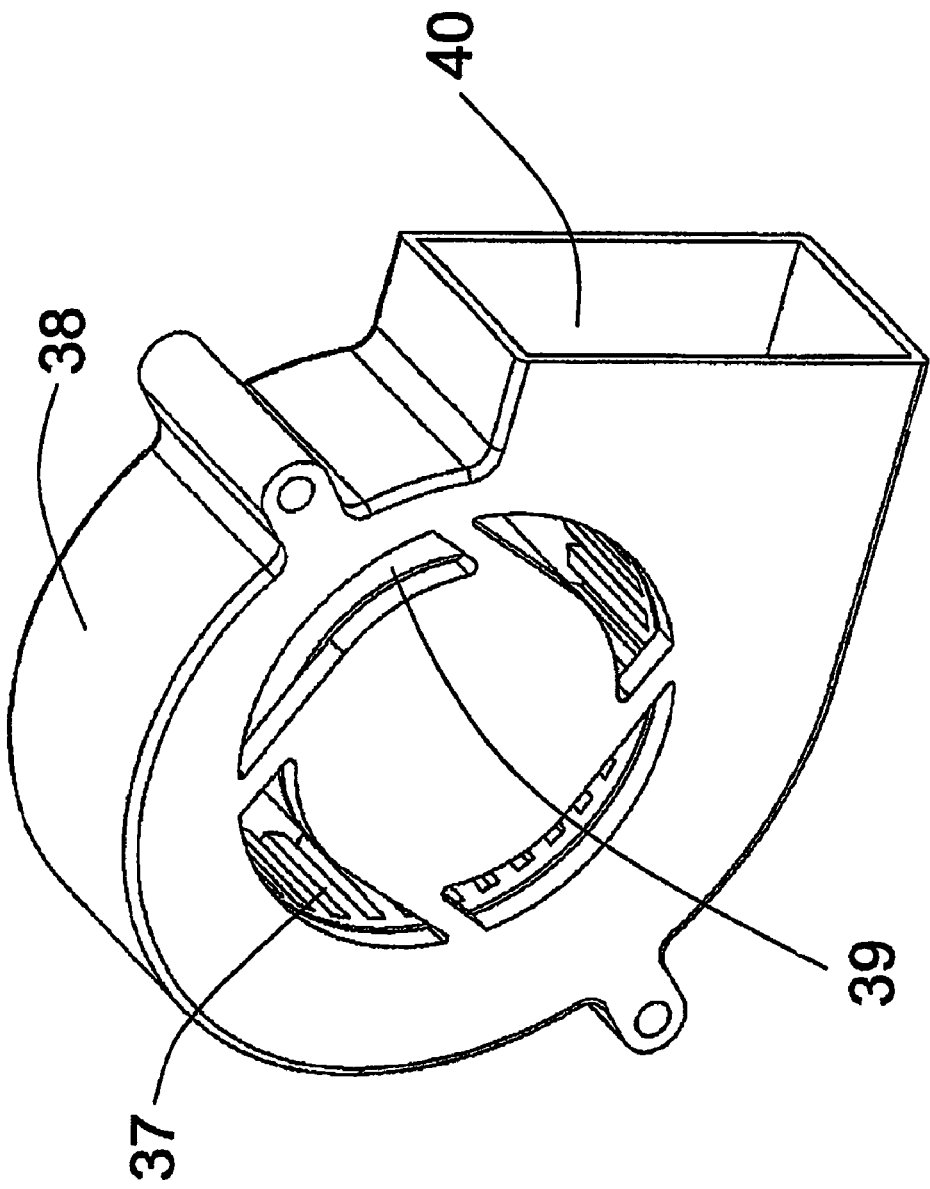
FIG. 12 illustrates a typical HVAC blower from the prior art.

Such a thermal management scheme exploits the fact that an impeller such as that shown in FIG. 5 may generate relatively high static pressures, comparable to (or greater than, if necessary) the centrifugal blowers widely used in commercial heating, ventilation, and air conditioning (HVAC) systems. A typical HVAC blower is shown in FIG. 12. Similar to the thermal management system described above, it takes the form of an impeller 37 enclosed in a manifold 38 whose geometry defines inlet 39 and outlet 40 ports that can be plumbed directly to air delivery and exhaust ducts, respectively. The above thermal management scheme also exploits the fact that the thermal resistance of such an air-cooled heat exchanger may be much lower than that of a traditional HSPF device. This much lower thermal resistance may mean that even if the outside air is significantly warmer than room temperature (e.g., 40° C. rather than 20° C.), such an air cooled heat exchanger can still perform its intended function of keeping the temperature of a thermal load below some predetermined value (e.g., 80° C.). It should be understood that more generally such a thermal management scheme may be applicable to any building, enclosure, or apparatus containing one or more thermal loads, including but not limited to a power plant, factory, computer data center, computer server farm, commercial building, laboratory, office, public space, residential dwelling, transport vehicle, instrument or machine.

In a particular embodiment, the thermal resistance of a heat exchanger comprising embodiments described herein may be adjusted by adjusting heat transfer structure speed of rotation and/or translation. In a further embodiment, such a heat exchanger having adjustable thermal resistance comprises a portion of a temperature control system.

In applications such as CPU cooling, air drawn into an inlet vent of a cooling system may contain a significant quantity of dust, particulate matter, and/or other contaminants, some of which may be deposited onto the surface of a finned heat sink. As a result, the performance of conventional CPU coolers based on the HSPF architecture may degrade over time, and eventually may lead to CPU malfunction. If the heat transfer structure rotates at high speed, an additional advantage over the prior art may be greatly reduced dust accumulation. To the extent that dust does accumulate, the direction of high speed rotation for such a heat transfer structure could also occasionally be reversed for a brief period of time, which may provide a "self-cleaning" mode of operation. Such a function could be controlled either in software (e.g., a computer operating system), hardware (e.g., a brushless motor driver circuit), or both. In applications where heat exchanger performance may be degraded by condensation and/or ice formation on a heat transfer structure, the use of a heat transfer structure that rotates at high speed may largely eliminate such problems. Lastly, if such a heat transfer structure is held in place by a magnet, rather than adhesive, heat sink paste, etc., this may facilitate easy removal of the finned heat transfer structure for extremely thorough cleaning if desired (e.g., cleaning in an ultrasonic bath).

In the representative embodiment shown FIGS. 5, 6 and 10, the gap region 12 and 43, respectively, may be filled with air. However, such a gap region may contain any mixture of gases, or alternatively, a pure gas. For example, the use of helium instead of air might be worthwhile in some applications because helium has approximately six times the thermal conductivity of air. In addition, such a system need not operate at or near atmospheric pressure. In some applications, operation above or below atmospheric pressure may confer certain advantages.

In the representative embodiment shown in FIGS. 5, 6 and 10, the shape of air gap region 12 and 43, respectively, between heat conducting structure 11 and heat transfer structure 13 and between IC package 42 and impeller structure 41 may be that of a cylinder with a very small height-to-diameter ratio. But an alternative gap region geometry may be used without departing from claimed subject matter (e.g., a non-cylindrical solid of revolution). For example, the heat conducting structure and heat transfer structure could be configured to have a substantially coaxial geometry, in which case the gap region may be described as having approximately the shape of a cylindrical shell. A gap region defined by a heat conducting structure and heat transfer structure separated by a distance that is substantially non-constant as a function of position may be used as well.

In particular embodiments, such a gap region may be adapted to provide substantially low thermal resistance. In this context, "substantially low thermal resistance" means that the thermal resistance between a heat conducting structure and a heat transfer structure is substantially less than the thermal resistance between said heat transfer structure and a surrounding medium, under certain operating conditions. For example, referring to FIG. 5, the thermal resistance between a heat-sink-impeller and a base plate may be substantially lower than the thermal resistance between said heat-sink-impeller and the surrounding air, if the heat-sink-impeller rotates at 1000 rpm. In particular embodiments, such a gap region may be adapted to provide substantially low-friction between a heat transfer structure and a heat conducting structure. In this context, "substantially low-friction" means that friction between a heat conducting structure and a heat transfer structure is substantially less than friction between said heat transfer structure and a surrounding medium, under certain operating conditions. For example, referring to FIG. 5, the amount of friction (e.g., resistance to rotation) between a heat-sink-impeller and a base plate may be substantially lower than the amount of friction between said heat-sink-impeller and the surrounding air, if the heat-sink-impeller rotates at 1000 rpm (e.g., because of aerodynamic drag).

In the representative embodiment shown in FIGS. 5, 6, and 10 a nominal air gap separation distance may be about 5 µm. However, there are situations in which this gap distance could be smaller or larger, depending on device size, operating environment, etc. For example, it may be possible to use submicron gap distances comparable to gas bearings used in certain classes of magnetic memory devices. The inclusion of structures adapted to generate convective mixing in the gas filled gap region may allow the use of considerably larger air gap distances. Thus the 5 µm separation distance cited for the representative embodiment herein is illustrative only and should not be construed as a rigid guideline or limitation.

In the representative embodiment shown in FIGS. 5 and 6, an interface between heat conducting structure 11 and heat transfer structure 13 may be configured as a hydrodynamic air bearing. Here, a wide variety of hydrodynamic gas bearing designs could be used instead of the Rayleigh Step Bearing illustrated in the representative embodiment. For example, particular embodiments illustrated above may use six identical grooves, each of which has a flat bottom, vertical walls, and a radial orientation. Any of these specifications may be changed without departing from claimed subject matter, however. With any such hydrodynamic gas bearing, instead of locating grooves on a surface of such a heat conducting structure, such grooves could be located on a surface of a rotating heat transfer structure, or such grooves could be included on both surfaces. Lastly, something other than a radial grooved structure, such as tangential grooves, combinations of radial and tangential grooves, or a textured (e.g., etched) rather than grooved surface may be used instead, or any combination thereof.

A hydrostatic (externally pressurized) air bearing could also be used. Such a hydrodynamic or hydrostatic gas bearing may also be equipped with one or more filters to prevent particulates and other sources of contamination from entering the gap region. Magnetic or electrostatic levitation bearings may be used as well. Lastly, a high-flow-rate hydrostatic bearing could be implemented such that a significant portion of the heat disposal provided by such a device is associated with the airflow through the narrow gap region.

In another embodiment, one or more lifting surfaces (fixed or variable airfoils) may be incorporated into a rotating transfer sink structure that may generate a lifting force in the positive z direction, or a downward restoring force in the negative z direction. In yet another embodiment, a rotor/stator assembly may be designed to generate a substantially non-zero magnetic force component along the z-axis that can be used as a lifting force in the positive z direction, or a downward restoring force in the negative z direction. In yet another embodiment, a downward restoring force in the negative z direction may be generated by substantial evacuation of a region between the heat conducting structure and the heat transfer structure using "vacuum preloading", in which a vacuum may be generated by an external pump, a pump integral to and powered by the rotating heat transfer structure, or both. Lastly, in a further embodiment, a gap distance is substantially zero, such that there is sliding contact between a surface of the heat transfer structure and a surface of the heat conducting structure, and wherein none, either or both, of these surfaces are either fully or partially treated with a lubricant and/or an anti-friction coating.

Gap distance may be passively regulated (e.g., by a balance of magnetic and pressure forces acting on a heat transfer structure, as in the representative embodiment shown in FIGS. 5 and 6), actively regulated (e.g., using a gap distance sensor and an actuator adapted to vary the gap distance), or unregulated (in which case gap distance may not be controlled, regulated or predetermined in any particular manner), depending upon the requirements of the particular application. Combinations of different regulation schemes may be used as well. One or more components or parameters that determine the gap distance may also be made adjustable. For example, in the representative embodiment shown in FIGS. 5 and 6), one or both of the rare earth magnets (14 and 15) could include a provision for adjusting the distance (and therefore the attraction force) between the two magnets. If a single permanent magnet and a piece of magnetic material such as high-magnetic permeability steel may be used, such an adjustment could be implemented in the form of a threaded steel plunger.

If a gas bearing system requires a mechanism to provide an auxiliary lifting force to maintain separation of a heat conducting structure and heat transfer structure at low rotational speed (e.g., during startup and shutdown) a wide variety of implementations are possible. Alternatively, such a lifting force could be applied on a continuous basis, and counteracted by an auxiliary downward force that may be applied at high rotational speed. Possible implementations may include, but are not limited to, use of a hydrodynamic foil/gas bearing (cf. Agrawal, G. L., "Foil/Gas Bearing Technology, An Overview," American Society of Mechanical Engineering, Publication 97-GT-347, 1997), use of an externally pressurized gas bearing, a means for providing an electromagnetic lifting force (incorporated into the motor and/or implemented as an independent structure), a transient repulsive force generated by applying a transient magnetic field that induces a transient eddy current in an electrically conductive structure (e.g., a heat transfer structure made of an electrically conductive metal) in accordance with Lenz's law (cf. Griffiths, D. G., Introduction to Electrodynamics, Prentice-Hall Inc., Englewood Cliffs, N.J., 1981), a centrifugally actuated auxiliary bearing, bushing, or other suitable structure that automatically deploys or retracts as the speed of rotation increases and/or decreases, and a wide variety of other automatically actuated or manually actuated mechanical devices, any equivalent structures, or combinations thereof.

In the representative embodiments illustrated in FIGS. 5, 6, and 10 there may be no mechanism adapted to provide translation of the heat transfer structure 13 or impeller 41 relative to the heat conducting structure 11 or package 42, respectively. In the representative embodiments illustrated in FIGS. 5, 6, and 10, a mechanism adapted for imparting rotation to the heat transfer structure may comprise a two phase, doubly salient, synchronous, variable reluctance motor. Such a motor may have four stator cores 16, four sets of stator windings 17, and four rotor teeth 18, incorporated directly into a heat conducting structure 11 and heat transfer structure 13, respectively. Stator cores and stator teeth may be fabricated from AISI 416 stainless steel, which has substantially high magnetic permeability, is corrosion resistant, and has excellent machinability. Each phase may comprise opposite stator pole pairs, and use alternating current waveforms approximately 90° out of phase to excite the two phases (cf. Chapman, S. J., Electric Machinery Fundamentals, 4th edition, McGraw-Hill, New York, 2005). An advantage of this design is its simplicity from the standpoint of fabrication. But this particular motor architecture does have some drawbacks; it is not self-starting (e.g., at rest, there are four rotor positions at which the net torque acting on the rotor is always zero) and the use of non-laminated stator cores and rotor blades may result in substantially large eddy current losses, especially if such a motor is operated at high speed (high excitation frequency).

It should be understood, however, that these are merely examples of how stators and rotors may be fabricated according to particular embodiments and that other rotors and stators, either fabricated from current or future techniques, may be used without deviating from claimed subject matter. For example, in other particular implementations, rotors may be fabricated from magnetically poled (e.g., a ring of magnetic material with alternating north and south pole segments), high electrical-resistivity and/or laminated material, and stators may be fabricated from high-electrical resistivity and/or laminated material. A magnetically poled rotor may allow construction of a simple two-phase motor that is self-starting from any initial position. Use of high-electrical resistivity and/or laminated stator and rotor poles may minimize eddy current losses. It should also be understood that a wide variety of other means for imparting rotation and/or translation to such a heat transfer structure may be used without departing from claimed subject matter. These include, but are not limited to, a motor integral to an assembly comprising a heat conducting structure and heat transfer structure of a different type than motors described herein, or the use of a non-integral, separate motor of any type, with torque transmitted to a heat transfer structure by any means. More generally, any source of mechanical actuation may be used, including, but not limited to, an electrical motor, an internal combustion engine, an air motor, a water-powered motor, etc., or any combination thereof.

Such a motor may also provide the additional functionality of a radial bearing, thrust bearing, or both. For example, a system that uses a hydrostatic gas bearing may incorporate spiral or other appropriately shaped grooves or channels into a bottom surface of a heat transfer structure, the interior region of a heat transfer structure, or both, to impart rotation to a heat transfer structure (cf. Satomi T. and Lin G., "Design Optimization of Spirally Grooved Thrust Air Bearings for Polygon Mirror Laser Scanners," JSME, International Journal, Series C, Vol. 36, No. 3, pp. 393-399, 1993).

In the representative embodiment illustrated in FIGS. 5 and 6, the axis of rotation may be maintained substantially constant by the attractive interaction of a first rare earth magnet 14 incorporated into the heat transfer structure 13, and a second rare earth magnet 15 (shown in FIG. 6) embedded in the heat conducting structure 11. This keeps the rotating heat transfer structure 13 approximately centered on the base plate 11, even if the base plate may be tilted or not mounted level. Alternatively, one rare earth magnet could be replaced with a piece of soft magnetic material, such as high-magnetic-permeability steel. In another embodiment, a hydrodynamic bearing may be configured as a hybrid thrust/radial gas bearing (e.g., by locating a rotating heat transfer structure in a close-fitting, grooved, cylindrical cavity). Such a mechanism adapted to maintain a substantially constant axis of rotation may also employ some form of radial bearing, including but not limited to, a conventional mechanical radial bearing, bushing or spindle, a hydrostatic or hydrodynamic radial gas bearing, an alternative form of magnetic radial bearing (e.g., different than that used in the representative embodiment), etc. In addition, such a radial bearing structure may also incorporate the function of a thrust bearing.

A thermal load may take any form, and may be thermally coupled to a heat conducting structure either directly (e.g., a CPU mounted directly to a heat conducting structure), or indirectly (e.g., a CPU mounted to the surface of a heat pipe structure, which in turn is mounted on a heat conducting structure). Such a thermal load may also be thermally coupled to the heat conducting structure by any means of heat transfer (e.g., conduction, convection, radiation, mass transfer, or any combination thereof). Flow of heat may be into or out of a thermal load, and embodiments described herein may be used in both cooling and heating applications. In particular embodiments, a heat conducting structure and the thermal load are separate elements connected by one or more low-thermal-resistance joints. In an alternative embodiment, a heat conducting structure and a thermal load may be constructed as a monolithic assembly, in which case there may be no requirement for such a low thermal resistance joint.

In the representative embodiments shown in FIGS. 5, 6, and 10 the medium surrounding the heat transfer structure 13 or 41 that provides a large thermal reservoir for heat disposal may comprise air. But such a thermal reservoir could also be any gas or gas mixture other than air, or a condensed-phase medium such as a liquid (e.g., water, oil, solvents, lubricants, etc.), a suspension, a slurry, a powder, or any other non-solid condensed-phase media or combinations thereof.

Particular values of parameters in the representative embodiment illustrated in FIGS. 5, 6, and 10 have been provided merely as examples according to a particular embodiment. It should therefore be understood that such parameters may take on other values depending on performance requirements, desired engineering tradeoffs, etc.

For example, in the particular device shown in FIG. 5, a heat-sink-impeller has 100 fins. But more generally, selection of a number of fins may involve a lengthy series of experimental measurements and/or flow field modeling in the vicinity of a rotating heat transfer structure. As with any heat exchanger, adding more fins may be desirable from the standpoint of increasing the total fin surface area. But at the same time, adding more fins may increase drag, and fin cross-sectional area in the x-y plane may not be large enough to provide adequate conduction of heat from the base of the fin to the top of the fin. An additional penalty that may be associated with increased drag is that operating at lower rpm may lessen the boundary-layer-thinning effect provided by placing the boundary layer in an accelerating frame of reference.

Experimental measurements and/or flow field modeling in the vicinity of a rotating heat transfer structure may also be required to determine an optimal fin "duty cycle". Here, fin duty cycle may be defined as a fin thickness divided by a fin-to-fin period in the azimuthal direction. In the device shown in FIG. 5, such a fin duty cycle is approximately 35%. Using fins thicker in an azimuthal direction to lower internal thermal resistance may reduce the width of air slots between fins, restricting the flow of air. Fin sweep angle and swept curvature geometry may also be altered for particular applications. The device shown in FIG. 5 has a sweep angle of 60° and a constant radius of sweep curvature in the x-y plane. Related to the question of fin geometry, another consideration is the fraction of the area on the rotating disk that is populated by fins. In the device shown in FIG. 5, an annular region containing fins corresponds to 80% of the total area of a rotating disk. Increasing fin areal coverage may provide better heat sinking. Again, however, the effects of restricting air intake in the center region of the impeller may need to be considered.

Experimental measurements and/or flow field modeling in the vicinity of a rotating heat transfer structure may also be required to optimize design parameters for a hydrodynamic gas bearing. For example, the number and geometry of the radial grooves used in the representative embodiment may not be optimal.

Finally, to the extent necessary to understand or complete the disclosure herein, all publications, patents, and patent applications mentioned herein are expressly incorporated by reference therein to the same extent as though each were individually so incorporated.

Having thus described exemplary embodiments of the present application, it should be noted by those skilled in the art that the disclosures herein are exemplary only and that various other alternatives, adaptations, and modifications may be made within the scope of the present application.

Accordingly, the present application is not limited to the specific embodiments as illustrated herein, but is only limited by the following claims.

What is claimed is:

1. An apparatus comprising:
a heat conducting structure having a first surface and a second surface, wherein the first surface is adaptable to be in thermal contact with a thermal load; and
a heat transfer structure immersed in a surrounding medium, the heat transfer structure having a third surface substantially parallel to the second surface of the heat conducting structure, said heat transfer structure being coupled to said heat conducting structure using a gas bearing structure, the gas bearing structure configured to cause a gas filled gap region to form between said second surface and said third surface at least in part responsive to a motion of said heat transfer structure, and wherein the heat transfer structure is supported by the gas filled gap region during operation of the apparatus, said gas filled gap region having a substantially low thermal resistance, and said heat transfer structure being movable relative to said heat conducting structure.

2. The apparatus of claim 1, wherein said heat transfer structure is provided with surface features comprising one or more of fins, vanes, blades, channels, ducts, pins, posts, plates, slots, protrusions, recesses, perforations, holes, textured surfaces, segmented elements, staggered elements, and smooth surfaces.

3. The apparatus of claim 2, wherein said surface features are disposed of in a forward swept, backward swept, and/or radial orientation.

4. The apparatus of claim 1, wherein said gas bearing structure is adapted to maintain said gas filled gap region.

5. The apparatus of claim 1, and further comprising a mechanism adapted to rotate and/or translate said heat transfer structure relative to said surrounding medium and/or heat conducting structure.

6. The apparatus of claim 5, and further comprising one or more mechanisms adapted to maintain a constant axis of rotation.

7. The apparatus of claim 5, and further comprising at least one rotor member and one or more stator coils adapted to impart rotation to said heat transfer structure.

8. The apparatus of claim 5, wherein said heat transfer structure is adapted to pump, circulate, and/or impart motion to said surrounding medium.

9. The apparatus of claim 5, and further comprising a means for varying an angular velocity of said heat transfer structure.

10. The apparatus of claim 5, wherein angular velocity of said heat transfer structure is high enough to induce turbulent flow over a portion of one or more surfaces of said heat transfer structure.

11. The apparatus of claim 5, wherein said heat transfer structure comprises at least one structural element for generating turbulence or promoting convective transport in said gas filled gap region, wherein the thermal resistance of said gas filled gap region is reduced.

12. The apparatus of claim 5, wherein reverse rotation of said heat transfer structure is adapted to removal of foreign matter, including but not limited to particulates, condensation and/or ice, from one or more surfaces said heat transfer structure.

13. The apparatus of claim 1, wherein at least one of said second surface and said third surface comprises a lubricant coating, anti-friction coating, or both.

14. The apparatus of claim 1, wherein said surrounding medium comprises a pure gas or a mixture of gases.

15. The apparatus of claim 1, wherein said gas filled gap region comprises a pure gas or a mixture of gases.

16. The apparatus of claim 1, and further comprising:
- an inlet port adapted to direct air received from outside of a building and/or enclosure to said heat transfer structure; and
- an outlet port adapted to direct heated air from said heat transfer structure to outside said building and/or enclosure.

17. The apparatus of claim 1, wherein said apparatus is adapted to thermal management of one or more active and/or passive electronic components, including but not limited to a resistor, capacitor, inductor, transformer, diode, rectifier, thyristor, transistor, amplifier, integrated circuit, display driver, line driver, buffer, microprocessor, central processing unit, graphics processing unit, coprocessor, transducer, sensor, actuator, power supply, ac to dc converter, dc to ac converter, dc to dc converter, ac to ac converter, or printed circuit assembly.

18. The apparatus of claim 1, wherein said gas bearing structure comprises a hydrodynamic gas bearing.

19. A method of transferring heat between a thermal load and a surrounding medium, comprising providing a heat conducting structure in thermal contact with a thermal load, a movable heat transfer structure through which heat may be exchanged with a surrounding medium, a gas filled gap region between at least one surface of said heat conducting structure and at least one surface of said heat transfer structure, wherein said gas filled gap region forms at least in part due to a motion of said heat transfer structure, the method further comprising transferring heat between said at least one surface of said heat conducting structure and at least one surface of said heat transfer structure through said gas filled gap region and transferring heat between said heat transfer structure and said surrounding medium.

* * * * *